United States Patent
Yamamoto et al.

(10) Patent No.: US 9,641,188 B1
(45) Date of Patent: May 2, 2017

(54) POWER ROUTER APPARATUS FOR GENERATING CODE-MODULATED POWERS

(71) Applicant: Panasonic Intellectual Property Management Co., Ltd., Osaka (JP)

(72) Inventors: Atsushi Yamamoto, Kyoto (JP); Shoichi Hara, Tokyo (JP); Taiki Nishimoto, Osaka (JP); Kohei Masuda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/270,919

(22) Filed: Sep. 20, 2016

(30) Foreign Application Priority Data

Oct. 23, 2015 (JP) .................................. 2015-208607

(51) Int. Cl.
H03M 3/00 (2006.01)
H03M 1/06 (2006.01)
(52) U.S. Cl.
CPC ........... H03M 1/0617 (2013.01); H03M 3/00 (2013.01)
(58) Field of Classification Search
CPC .............................. H03M 3/00; H03M 1/0617
USPC ......................................................... 341/143
See application file for complete search history.

(56) References Cited

U.S. PATENT DOCUMENTS 6,836,231 B2 * 12/2004 Pearson ............... G01R 29/085
341/143
2012/0185708 A1   7/2012 Rekimoto et al.

FOREIGN PATENT DOCUMENTS

| JP | 11-146564 | 5/1999 |
|---|---|---|
| JP | 11-182256 | 7/1999 |
| JP | 2003-009543 | 1/2003 |
| JP | 2003-348118 | 12/2003 |
| JP | 2009-077606 | 4/2009 |
| JP | 2011-091954 | 5/2011 |
| JP | 2013-138612 | 7/2013 |

OTHER PUBLICATIONS

International Search Report of PCT application No. PCT/JP2016/003514 dated Oct. 11, 2016.

* cited by examiner

*Primary Examiner* — Khai M Nguyen
(74) *Attorney, Agent, or Firm* — McDermott Will & Emery LLP

(57) ABSTRACT

A power router apparatus includes: a power divider that divides predetermined power into a plurality of divided powers including first divided power and second divided power; a first code modulator that code-modulates the first divided power with a first modulation code to generate first code-modulated power, which is alternating-current power; and a second code modulator that code-modulates the second divided power with a second modulation code to generate second code-modulated power, which is alternating-current power.

10 Claims, 35 Drawing Sheets

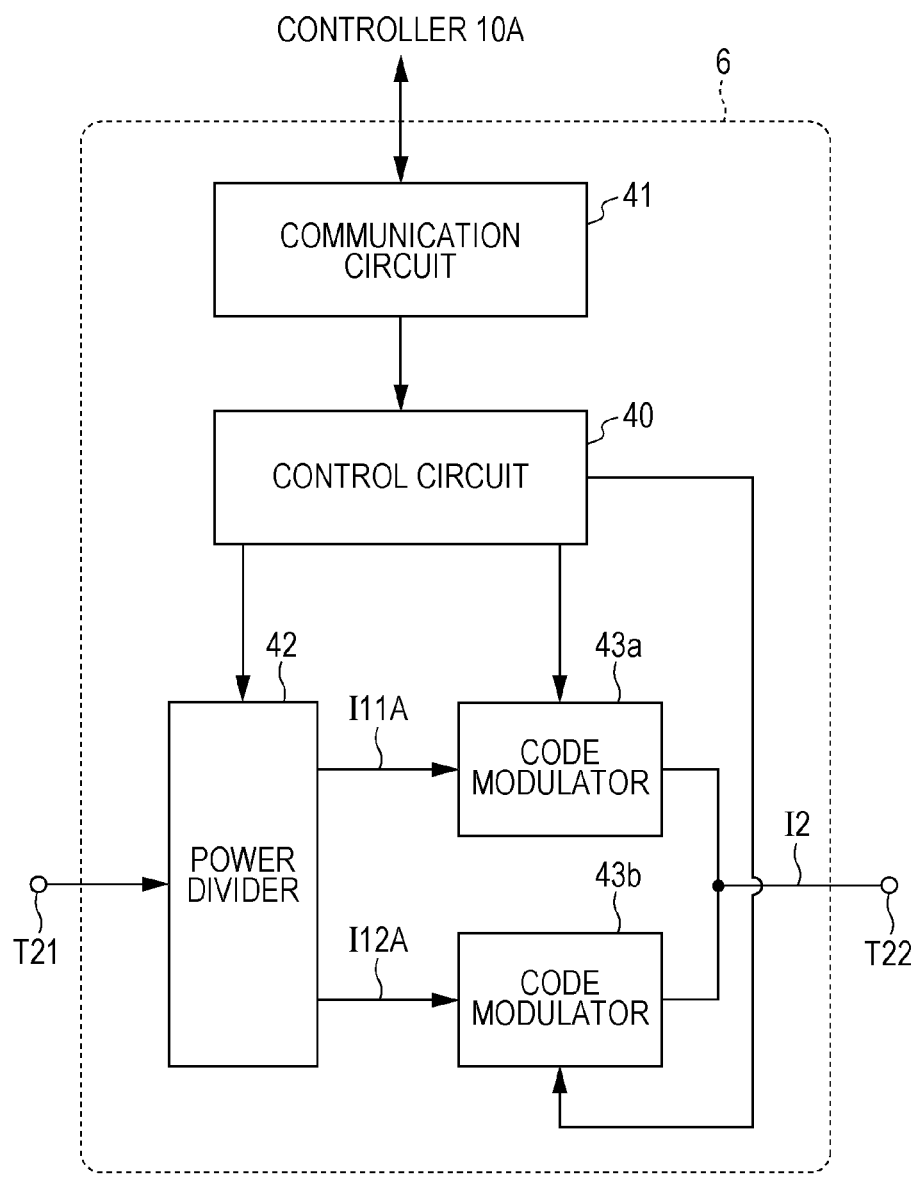

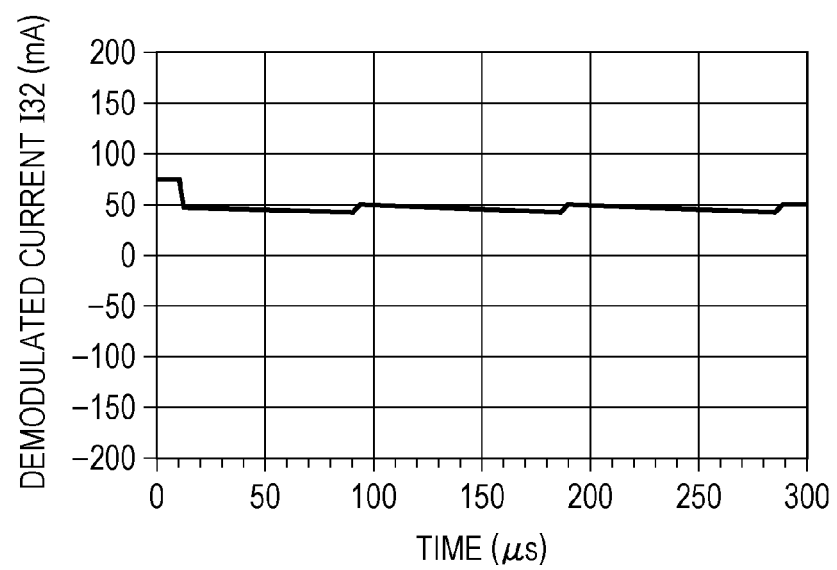

US 9,641,188 B1

POWER ROUTER APPARATUS FOR GENERATING CODE-MODULATED POWERS

BACKGROUND

1. Technical Field

The present disclosure relates to a power router apparatus and a power transmission system having the power router apparatus.

2. Description of the Related Art

In recent years, installing a local, small-scale power grid has been proposed in order to reduce losses due to long-distance power transmission and in order to realize power self-sufficiency. Examples of apparatuses and devices that can be connected to such a power grid include, a direct-current (DC) power supply, an alternating-current (AC) power supply, and loads that require different power values.

Japanese Unexamined Patent Application Publication No. 2013-138612 discloses a multi-terminal power conversion apparatus for asynchronously and flexibly supplying power.

Japanese Unexamined Patent Application Publication No. 2011-91954 discloses a power supply apparatus including a communication unit that transmits/receives information signals to/from another apparatus and a power-supply unit that supplies power to the other apparatus.

SUMMARY

In one general aspect, the techniques disclosed here feature a power router apparatus having: a power divider that divides predetermined power into a plurality of divided powers including first divided power and second divided power; a first code modulator that code-modulates the first divided power with a first modulation code to generate first code-modulated power; and a second code modulator that code-modulates the second divided power with a second modulation code to generate second code-modulated power. The first code-modulated power is AC power, and the second code-modulated power is AC power.

It should be noted that comprehensive or specific embodiments may be implemented as a power transmission system, or a power transmission method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 14 is a block diagram illustrating an example configuration of a power router apparatus according to the first embodiment;

FIG. 15E is a graph illustrating the waveform of a second demodulated current according to the first example operation in the first embodiment;

DETAILED DESCRIPTION

Figure 1:
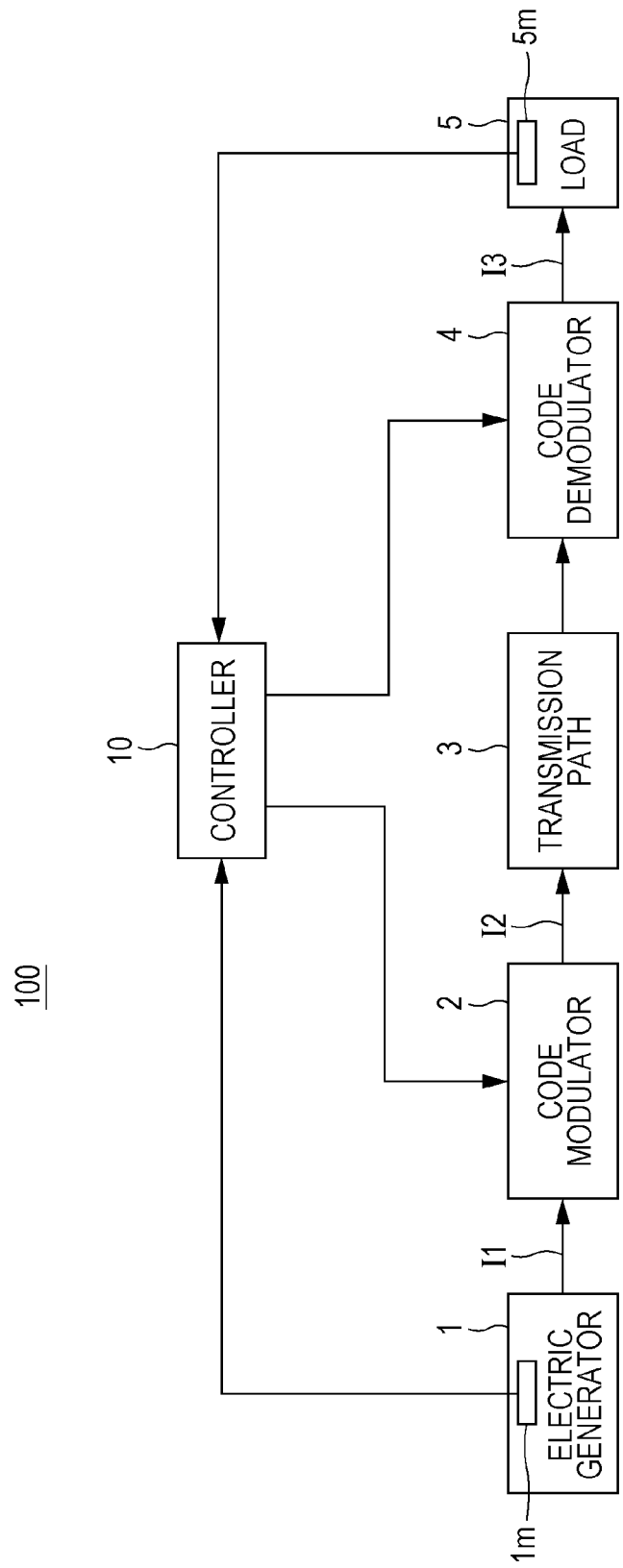
FIG. 1 is a block diagram illustrating an example configuration of a power transmission system according to a first reference mode.

Reference modes and embodiments according to the present disclosure will be described below with reference to the accompanying drawings. In each embodiment described below, the same or similar constituent elements are denoted by the same reference numerals and/or the same name.

Various modes described below all represent comprehensive or specific examples. Numerical values, codes, waveforms, the types of element, the arrangement and connection of elements, signal flows, circuit blocks, and so on described below are examples and are not intended to limit the present disclosure. In addition, constituent element not set forth in the independent claim that represents the broadest concept are optional constituent elements.

First Reference Mode

[1. Power Transmission System]

FIG. 1 illustrates the configuration of a power transmission system 100 according to a first reference mode. The power transmission system 100 includes an electric generator 1, a code modulator 2, a transmission path 3, a code demodulator 4, a load 5, and a controller 10.

The electric generator 1 generates electric power (e.g., DC power). The code modulator 2 code-modulates the generated power with a modulation code to thereby generate code-modulated power (i.e., a code-modulated wave). The code-modulated power is transmitted from the code modulator 2 to the code demodulator 4 through the transmission path 3. The transmission path 3 is, for example, a wired transmission line. The code demodulator 4 code-demodulates the code-modulated power with a demodulation code to thereby obtain power (e.g., DC power). The obtained power is supplied to, for example, the load 5.

The modulation code and the demodulation code are signals including respective predetermined code sequences.

The code-modulated power is AC power. In the present disclosure, the "AC power" refers to power whose flow direction reverses periodically or aperiodically and whose current average value and/or voltage average value are/is generally 0 in a sufficiently long period of time. The current (or voltage) average value being generally 0 means that the absolute value of the current (or voltage) average value after the code modulation is smaller than a predetermined value. This predetermined value is a value obtained by, for example, dividing the maximum value of a current (or a voltage) before the code modulation by the code length of the modulation code. The AC power has, for example, a waveform whose polarity changes at every predetermined period (e.g., a period corresponding to an integer multiple of a unit period).

The electric generator 1 has, for example, a power measuring instrument 1*m*. The power measuring instrument 1*m* measures the amount of electricity generated by the electric generator 1 and transmits the measured amount of electricity generated to the controller 10. The amount of electricity generated corresponds to, for example, the amount of power transmitted from the electric generator 1 to the code modulator 2. The power measuring instrument 1*m* may be provided at a stage prior to the code modulator 2.

The load 5 has, for example, a power measuring instrument 5*m*. The power measuring instrument 5*m* measures the amount of power used by the load 5 and transmits the measured amount of power used to the controller 10. The amount of power used corresponds to, for example, the amount of power transmitted from the code demodulator 4 to the load 5. The power measuring instrument 5*m* may be provided at a stage subsequent to the code demodulator 4.

Each of the electric generator 1 and the load 5 may be, for example, a power storage device, such as a battery or a capacitor. In this case, for example, power generated in a time segment in which the amount of power consumption is small can be stored, and the stored power can be effectively used. This makes it possible to enhance the power efficiency of the entire system.

The controller 10 receives information about the measured amounts of power and controls the code modulator 2 and the code demodulator 4 on the basis of the corresponding amounts of power. For example, the controller 10 transmits instruction signals to the code modulator 2 and the code demodulator 4.

The instruction signals include a synchronization signal for making the operation of the code modulator 2 and the operation of the code demodulator 4 synchronize with each other. The instruction signals transmitted to the code modulator 2 include, for example, timing information indicating a timing at which the generated power is to be code-modulated. The instruction signals transmitted to the code demodulator 4 include, for example, timing information indicating a timing at which the code-modulated power is to be code-demodulated. This makes it possible to cause the code modulation and the code demodulation of power to synchronize with each other accurately.

The instruction signals transmitted to the code modulator 2 include, for example, code information regarding the modulation code, and the instruction signals transmitted to the code demodulator 4 include, for example, code information regarding the demodulation code. In the present disclosure, the "code information" may be a code sequence itself, may be designation information for designating a specific one of a plurality of code sequences, or may be parameter information for generating a code sequence.

For example, the controller 10 may transmit a code sequence of a modulation code to the code modulator 2 and may transmit a code sequence of a demodulation code to the code demodulator 4.

For example, the controller 10 may transmit designation information that designates a code sequence of a modulation code to the code modulator 2, and the code modulator 2 may generate a modulation code on the basis of the designation information. The controller 10 may transmit designation information that designates a code sequence of a demodulation code to the code demodulator 4, and the code demodulator 4 may generate a demodulation code on the basis of the designation information.

Alternatively, the modulation code may be pre-set in the code modulator 2, and the demodulation code may be pre-set in the code demodulator 4.

Now, suppose a case in which the power transmission system 100 includes a plurality of electric generators 1, a plurality of code modulators 2, a plurality of code demodulators 4, and a plurality of loads 5, by way of example. In this case, for example, the controller 10 transmits the code information regarding the modulation code to one code modulator 2 selected from the plurality of code modulators 2 and transmits the code information regarding the demodulation code to one code demodulator 4 selected from the plurality of code demodulators 4. This allows power to be transmitted from the electric generator 1 connected to the selected code modulator 2 to the load 5 connected to the selected code demodulator 4.

FIG. 1 illustrates a generated current I1, a code-modulated current I2, and a code-demodulated current I3, instead of the generated power, the code-modulated power, and the code-demodulated power. Although an example in which a current is modulated and demodulated is described below, the present disclosure is not limited thereto, and for example, a voltage may be modulated and demodulated. The "current" in the description below can be read instead as a "voltage" or "power", as appropriate.

[2. Transmission Efficiency of Code-Modulated Power]

Figure 2:
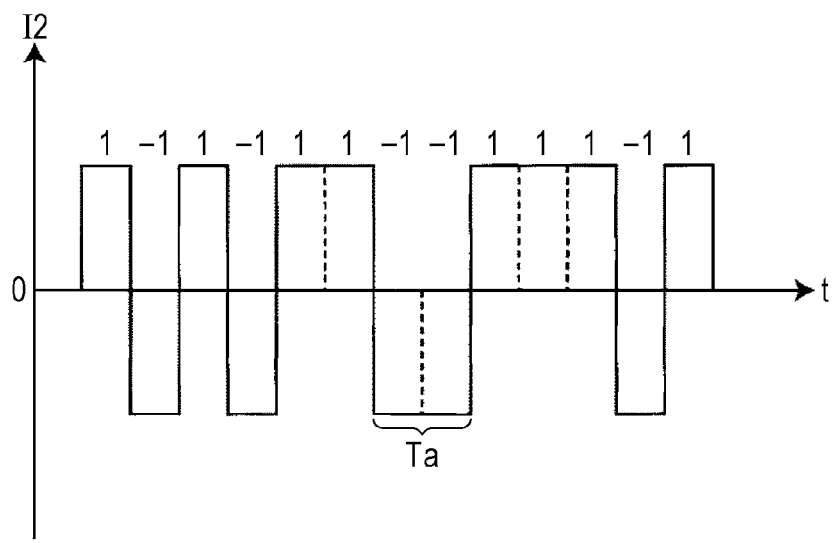
FIG. 2 is a diagram illustrating one example of the waveform of a modulated current according to the first reference mode.
Figure 3:
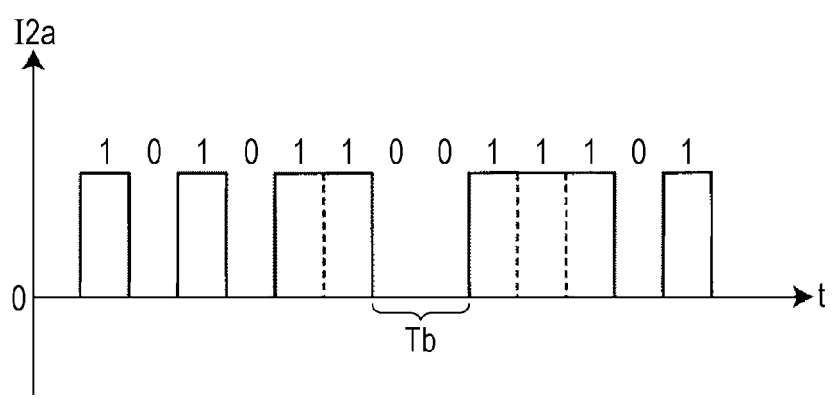
FIG. 3 is a diagram illustrating an example of the waveform of a modulated current according to a comparative example.

FIG. 2 illustrates an example of the waveform of the modulated current I2. FIG. 3 illustrates an example of the waveform of a modulated current I2a according to a comparative example. In FIG. 2, 1s and −1s represent values constituting a modulation code, the values corresponding to the current values of the modulated current I2 in corresponding periods. In FIG. 3, 1s and 0s represent values constituting a modulation code, the values corresponding to the current values of the modulated current I2a in corresponding periods. A code sequence consisting of 0s and 1s corresponds to a modulation code used in a typical communication system.

In the example illustrated in FIG. 2, the code modulator 2 converts the generated current I1 into a modulated wave (i.e., the modulated current I2) having "1s" and "−1s". Thus, the modulated current I2 is AC. In this case, in each period in which the modulated current I2 indicates "1", positive current is transmitted from the code modulator 2 to the code demodulator 4, and in each period in which the modulated current I2 indicates "−1" (e.g., a period Ta in FIG. 2), negative current is transmitted from the code modulator 2 to the code demodulator 4. Thus, power is transmitted in all periods, thereby realizing high transmission efficiency.

In the example illustrated in FIG. 3, the modulated current I2a has a modulated wave having "1s" and "0s" and is not AC. In this case, in a period in which the modulated current I2a indicates "0" (e.g., a period Tb in FIG. 3), the modulated current I2a becomes zero, and thus no power is transmitted. Thus, when the code-modulated power is not AC power, the power transmission efficiency decreases.

Comparison between FIG. 2 and FIG. 3 shows that power can be transmitted with high transmission efficiency when the code-modulated power is AC power, particularly, when the code sequence of the modulation code does not include "0".

[3. Code Modulation and Demodulation of DC Power]

Figure 4A:
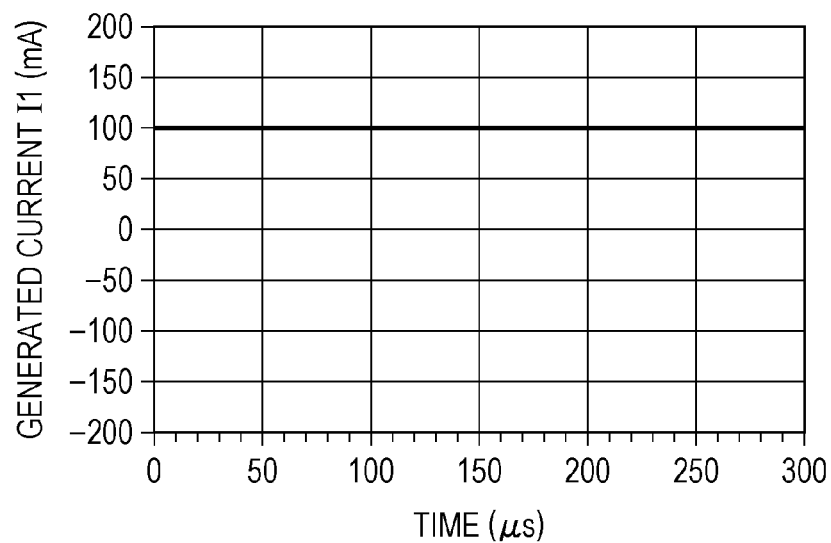
FIG. 4A is a graph illustrating one example of the waveform of the generated current according to the first reference mode.
Figure 4B:
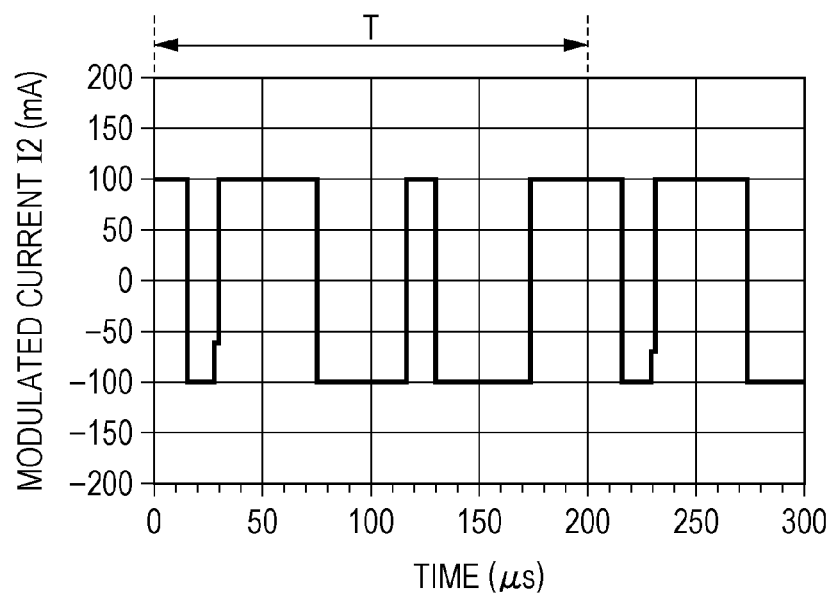
FIG. 4B is a diagram illustrating one example of the waveform of the modulated current according to the first reference mode.
Figure 4C:
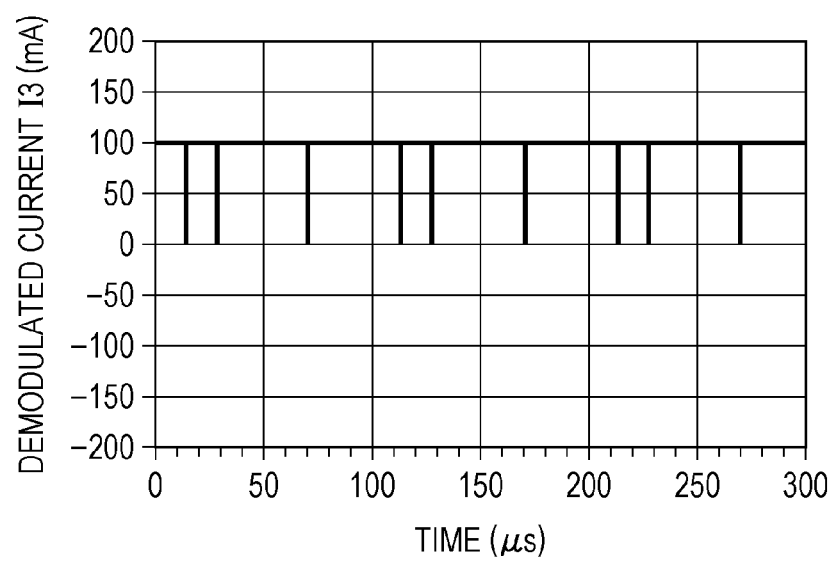
FIG. 4C is a diagram illustrating one example of the waveform of the demodulated current according to the first reference mode.

FIGS. 4A to 4C illustrate examples of the waveforms of the generated current I1, the modulated current I2, and the demodulated current I3, respectively.

The generated current I1 illustrated in FIG. 4A was DC.

The modulated current I2 illustrated in FIG. 4B was obtained by multiplying the generated current I1 by a modulation code M1. In this example, the modulation code M1 have a code sequence given by:

$$M1 = [1 \ -1 \ 1 \ 1 \ 1 \ -1 \ -1 \ -1 \ 1 \ -1 \ -1 \ -1 \ 1 \ 1] \quad (1)$$

The frequency of the modulation code was 35 kHz, and the time span of each value constituting the modulation code was 14.3 (={1/(35 kHz)}/2) µs. A period T illustrated in FIG. 4B represents one cycle of the code sequence of the modulation code M1.

The demodulated current I3 illustrated in FIG. 4C was obtained by multiplying the modulated current I2 with a demodulation code D1. In this example, the modulation code M1 and the demodulation code D1 had the same code sequence. That is, the demodulation code D1 had code sequences given by:

$$D1 = [1 \ -1 \ 1 \ 1 \ 1 \ -1 \ -1 \ -1 \ 1 \ -1 \ -1 \ -1 \ 1 \ 1] \quad (2)$$

In this case, the frequency of the demodulation code was 35 kHz, and the time span of each value constituting the demodulation code was 14.3 µs.

A result obtained by multiplying the modulated current I2 by the demodulation code D1 corresponds to a result obtained by multiplying the generated current I1 by M1×D1. In this case, M1×D1 has a code sequence given by:

$$M1 \times D1 = [1\ 1\ 1\ 1\ 1\ 1\ 1\ 1\ 1\ 1\ 1\ 1\ 1\ 1] \quad (3)$$

Thus, as illustrated in FIG. 4C, a DC equivalent to the generated current I1 was restored as the demodulated current I3 through the code modulation and the code demodulation.

As described above, the modulation and demodulation method according to this reference mode makes it possible to realize low-loss power transmission through accurate synchronization.

For example, when the modulation code M1 is repeatedly used in the manner illustrated in FIG. 4B, power can be transmitted with high efficiency for a long period of time.

In the above-described example, the eighth to 14th values of the modulation code M1 respectively correspond to values obtained by reversing the polarities of the first to seventh values of the modulation code M1. When such modulation code is used, the average of the modulated current I2 becomes 0, thus making it possible to realize transmission with only AC that is free of DC components. Thus, it is possible to transmit power with high transmission efficiency.

[4. Code Modulator and Code Demodulator]

Figure 5:
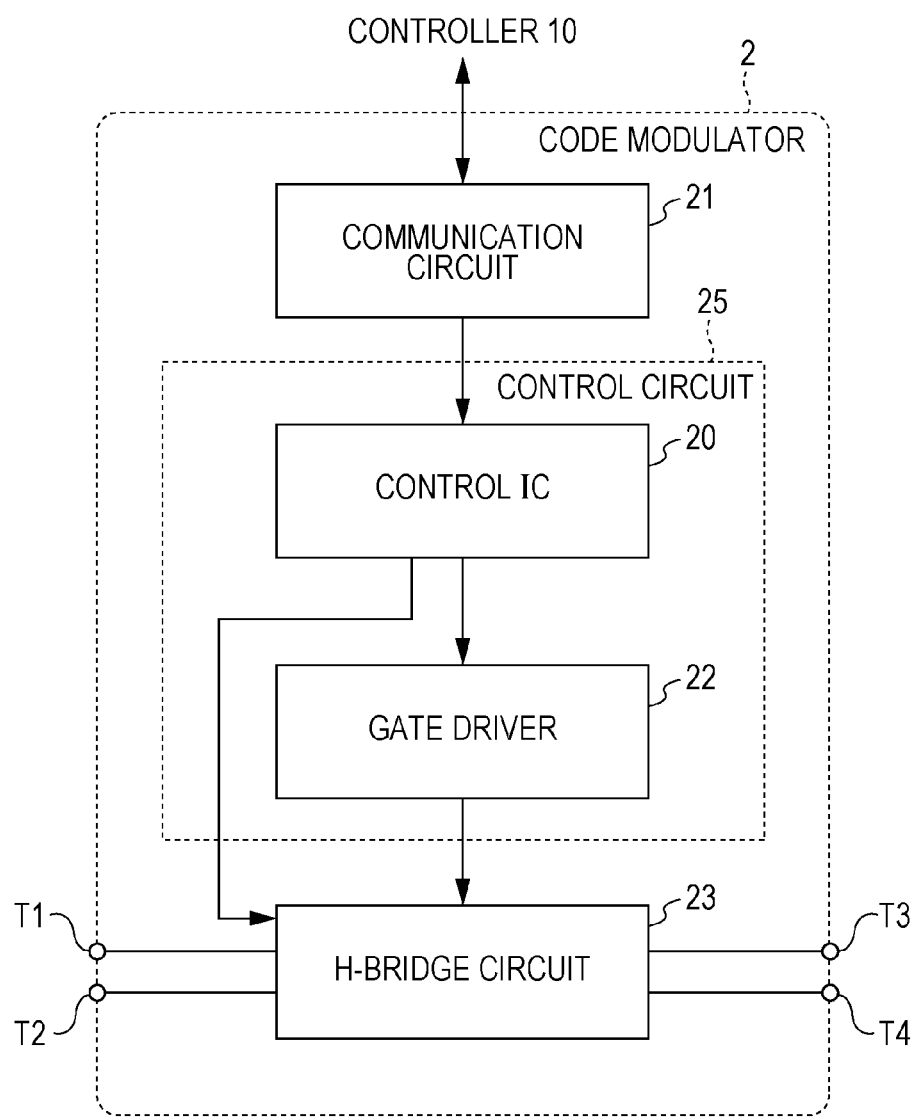
FIG. 5 is a block diagram illustrating an example configuration of a code modulator according to the first reference mode.

FIG. 5 illustrates an example configuration of the code modulator 2.

In FIG. 5, the code modulator 2 includes a communication circuit 21, a control circuit 25, and an H-bridge circuit 23. The control circuit 25 includes, for example, a control integrated circuit (IC) 20 and a gate driver 22.

The communication circuit 21 receives the instruction signals from the controller 10 and outputs the instruction signals to the control IC 20. The communication circuit 21 includes, for example, an antenna, a tuner circuit, and a wave detector.

The instruction signals include, for example, a synchronization signal and code information regarding the modulation code. Each synchronization signal may be, for example, a trigger signal for starting the modulation and/or may be a trigger signal for ending the modulation. Alternatively, the synchronization signal may be, for example, time information indicating the time at which the modulation is to be started and/or time information indicating the time at which the modulation is to be ended. The trigger signals and the time information are examples of timing information in the present disclosure.

The control IC 20 generates a modulation code on the basis of the instruction signals and causes the gate driver 22 to generate control signals according to the modulation code. The control IC 20 includes a processor. The control IC 20 is, for example, a microcomputer.

The gate driver 22 outputs the control signals to the H-bridge circuit 23 to thereby cause the H-bridge circuit 23 to execute a code modulation operation.

The code modulator 2 has input terminals T1 and T2 connected to the electric generator 1 and output terminals T3 and T4 connected to the transmission path 3.

Figure 6:
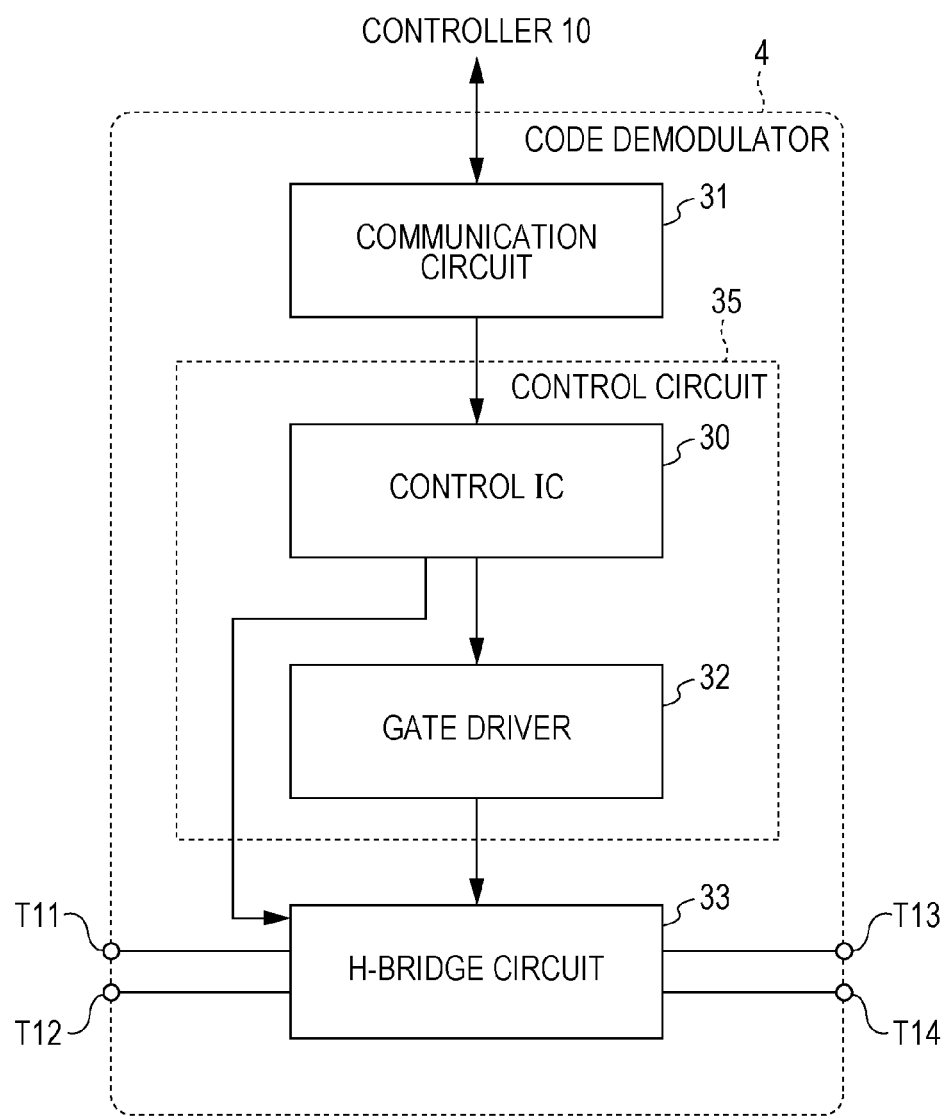
FIG. 6 is a block diagram illustrating an example configuration of a code demodulator according to the first reference mode.

FIG. 6 illustrates an example configuration of the code demodulator 4.

In FIG. 6, the code demodulator 4 includes a communication circuit 31, a control circuit 35, and an H-bridge circuit 33. The control circuit 35 includes, for example, a control IC 30 and a gate driver 32.

The communication circuit 31 receives the instruction signals from the controller 10 and outputs the instruction signals to the control IC 30. The communication circuit 31 includes, for example, an antenna, a tuner circuit, and a wave detector.

The instruction signals include, for example, a synchronization signal and code information regarding the demodulation code. The synchronization signal may be, for example, a trigger signal for starting the demodulation and/or a trigger signal for ending the demodulation. Alternatively, the synchronization signal may be, for example, time information indicating the time at which the demodulation is to be started and/or time information indicating the time at which the demodulation is to be ended. The trigger signals and the time information are examples of the timing information in the present disclosure.

The control IC 30 generates a demodulation code on the basis of the instruction signals and causes the gate driver 32 to generate control signals according to the demodulation code. The control IC 30 includes a processor and is, for example, a microcomputer.

The gate driver 32 outputs the control signals to the H-bridge circuit 33 to thereby cause the H-bridge circuit 33 to execute a code demodulation operation.

The code demodulator 4 has input terminals T11 and T12 connected to the transmission path 3 and output terminals T13 and T14 connected to the load 5.

As illustrated in FIG. 1, the controller 10 transmits the control signals to the code demodulator 4 and the code modulator 2 through paths different from the transmission path 3. The controller 10, however, may transmit the control signals to the code modulator 2 and the code demodulator 4 through the transmission path 3. In this case, the control signals can be transmitted, for example, through multiplexing with the code-modulated power. For example, this reduces the number of communication paths from the controller 10 to the code modulator 2 and the code demodulator 4, thereby making it possible to reduce cost.

Figure 7:
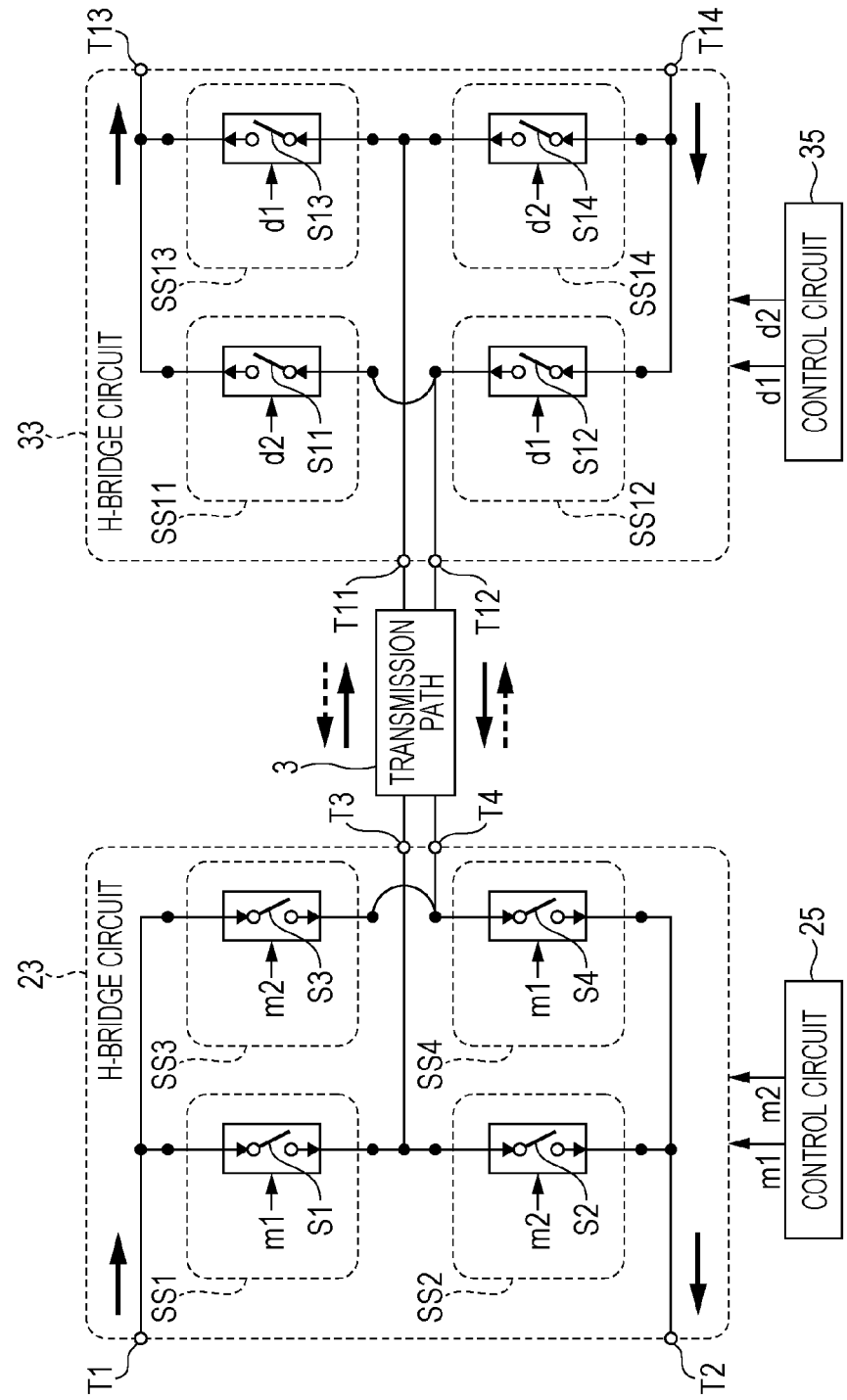
FIG. 7 is a schematic circuit diagram illustrating an example configuration of the code modulator, a transmission path, and the code demodulator according to the first reference mode.

FIG. 7 illustrates an example configuration of the control circuit 25 and the H-bridge circuit 23 in the code modulator 2 and an example configuration of the control circuit 35 and the H-bridge circuit 33 in the code demodulator 4.

In FIG. 7, the H-bridge circuit 23 includes four switch circuits SS1, SS2, SS3, and SS4 connected in a full-bridge configuration. For example, the switch circuits SS1, SS2, SS3, and SS4 include switches S1, S2, S3, and S4, respectively.

In FIG. 7, the H-bridge circuit 33 includes four switch circuits SS11, SS12, SS13, and SS14 connected in a full-bridge configuration. For example, the switch circuits SS11, SS12, SS13, and SS14 include switches S11, S12, S13, and S14, respectively.

Each of the switches S1 to S4 and S11 to S14 may be, for example, a bidirectional switch or a metal-oxide semiconductor (MOS) transistor.

The control circuit 25 generates predetermined code sequences m1 and m2. The control circuit 25 outputs the code sequence m1 to the switches S1 and S4 as control signals and outputs the code sequence m2 to the switches S2 and S3 as control signals.

For example, each of the switches S1 to S4 is in an ON state when a signal indicating "1" is input thereto, and each of the switches S1 to S4 is in an OFF state when a signal indicating "0" is input thereto. When the switch S1 is in the ON state, current flows from the terminal T1 to the terminal T3. When the switch S3 is in the ON state, current flows from the terminal T1 to the terminal T4. When the switch S2 is in the ON state, current flows from the terminal T3 to the terminal T2. When the switch S4 is in the ON state, current flows from the terminal T4 to the terminal T2.

The control circuit 35 generates predetermined code sequences d1 and d2. The control circuit 35 outputs the code sequence d1 to the switches S12 and S13 as control signals and outputs the code sequence d2 to the switches S11 and S14 as control signals.

For example, each of the switches S11 to S14 is in an ON state when a signal indicating "1" is input thereto, and each of the switches S11 to S14 is in an OFF state when a signal indicating "0" is input thereto. When the switch S11 is in the ON state, current flows from the terminal T12 to the terminal T13. When the switch S13 is in the ON state, current flows from the terminal T11 to the terminal T13. When the switch S12 is in the ON state, current flows from the terminal T14 to the terminal T12. When the switch S14 in the ON state, current flows from the terminal T14 to the terminal T11.

In FIG. 7, current that flows in the direction indicated by each solid-line arrow is regarded as positive current. In FIG. 7, the structure of the code modulator 2 and the structure of the code demodulator 4 are generally symmetrical to each other, but the directions in which the currents flow differ from each other.

[5. Operation]

[5-1. Control Signals]

Table 1 illustrates examples of code sequences of the control signals m1 and m2 input to the switches S1 to S4 in the code modulator 2 and examples of code sequences of the control signals d1 and d2 input to the switches S11 to S14 in the code demodulator 4.

TABLE 1

| CONTROL SIGNAL | CODE SEQUENCE |
| --- | --- |
| m1 | c1a = [1 0 1 1 1 0 0] |
| m2 | c1b = [0 1 0 0 0 1 1] |
| d1 | c1a = [1 0 1 1 1 0 0] |
| d2 | c1b = [0 1 0 0 0 1 1] |

In the examples, the code sequence of the control signals m1 and the code sequence of control signals d1 are the same code sequence c1a, and the code sequence of the control signals m2 and the code sequence of the control signals d2 are the same code sequence c1b. The code sequence c1b is a sequence obtained by inverting all bits of the code sequence c1a.

[5-2. Operation of Code Modulator]

A description will be given of the operation of the code modulator 2.

When the control signal m1 indicates "1", and the control signal m2 indicates "0", the switches S1 and S4 are in the ON state, and the switches S2 and S3 in the OFF state. At this point in time, a positive generated current I1 input to the code modulator 2 flows in the direction indicated by the solid-line arrow in FIG. 7, so that a positive modulated current I2 flows to the terminals T3 and T4. That is, the generated current I1 is code-modulated with "1".

On the other hand, when the control signal m1 indicates "0", and the control signal m2 indicates "1", the switches S1 and S4 are in the OFF state, and the switches S2 and S3 are in the ON state. At this point in time, a positive generated current I1 input to the code modulator 2 flows in the direction indicated by the dotted-line arrow in FIG. 7, so that a negative modulated current I2 flows to the terminals T3 and T4. That is, the generated current I1 is code-modulated with "−1".

The series of switching operations based on the control signals m1 and m2 illustrated in Table 1 corresponds to an operation for code-modulating the generated current I1 with the modulation code Ma given by:

$$Ma = [1\ -1\ 1\ 1\ 1\ -1\ -1] \quad (4)$$

Thus, the code modulator 2 code-modulates the generated current I1 with the modulation code Ma and outputs an AC modulated current I2 to the transmission path 3 via the terminals T3 and T4.

[5-3. Operation of Code Demodulator]

A description will be given of the operation of the code demodulator 4.

The control signals d1 and d2 are synchronized with the control signals m1 and m2. Thus, when a positive modulated current I2 is input to the code demodulator 4, the control signal d1 indicates "1", and the control signal d2 indicates "0". At this point in time, the switches S13 and S12 are in the ON state, and the switches S11 and S14 are in the OFF state. Thus, the positive modulated current I2 flows in the direction indicated by the solid-line arrow in FIG. 7, so that a positive demodulated current I3 flows to the terminals T13 and T14. That is, the modulated current I2 is code-demodulated with "1".

On the other hand, when a negative modulated current I2 is input to the code demodulator 4, the control signal d1 indicates "0", and the control signal d2 indicates "1". At this point in time, the switches S11 and S14 are in the ON state, and the switches S12 and S13 are in the OFF state. Thus, the negative modulated current I2 flows in the direction indicated by the solid-line arrow in FIG. 7, so that a positive demodulated current I3 flows to the terminals T13 and T14. That is, the modulated current I2 is code-demodulated with "−1".

The series of switching operations based on the control signals d1 and d2 in Table 1 corresponds to an operation for code-demodulating the modulated current I2 with the demodulation code Da given by:

$$Da = [1\ -1\ 1\ 1\ 1\ -1\ -1] \quad (5)$$

Thus, the code demodulator 4 code-demodulates the modulated current I2 with the demodulation code Da and outputs the positive demodulated current I3 via the terminals T13 and T14.

[5-4. Other Examples of Control Signals]

Table 2 illustrates other examples of the code sequences of the control signals m1, m2, d1, and d2.

TABLE 2

| CONTROL SIGNAL | CODE SEQUENCE |
| --- | --- |
| m1 | [c1a c1b] = [1 0 1 1 1 0 0 0 1 0 0 0 1 1] |
| m2 | [c1b c1a] = [0 1 0 0 0 1 1 1 0 1 1 1 0 0] |
| d1 | [c1a c1b] = [1 0 1 1 1 0 0 0 1 0 0 0 1 1] |
| d2 | [c1b c1a] = [0 1 0 0 0 1 1 1 0 1 1 1 0 0] |

In each of the code sequences of the control signals m1 and m2 illustrated in Table 1, the number of 1s is not equal to the number of 0s. Thus, in the code sequence of the modulation code Ma, the number of 1s and the number of −1s are not equal to each other. In such a case, the average of the modulated current I2 does not become 0, and the modulated current I2 is an AC including a small amount of DC components.

On the other hand, in Table 2, the control signals m1 and d1 each have a code sequence [c1a c1b] in which the code sequence c1a and the code sequence c1b are coupled in tandem, and the control signals m2 and d2 each have a code sequence [c1b c1a] in which the code sequence c1b and the code sequence c1a are coupled in tandem. Since the code sequence c1b is a sequence in which all bits of the code sequence c1a are inverted, as described above, the number of 1s and the number of 0s in a code sequence in which the code sequences c1a and c1b are coupled are equal to each other. Thus, the modulated current I2 is an AC that does not include DC components, thus further enhancing the transmission efficiency. The control signals m1 and m2 illustrated in Table 2 correspond to the modulation code M1 described above, and the control signals d1 and d2 correspond to the demodulation code D1 described above.

Second Reference Mode

A power transmission system according to a second reference mode is substantially the same as the power transmission system 100 described above in the first reference mode, except that the generated power is AC power. The following description will be given of the second reference mode, particularly, points that are different from the first reference mode.

[1. Code Modulation and Demodulation of AC Power]

Figure 8A:
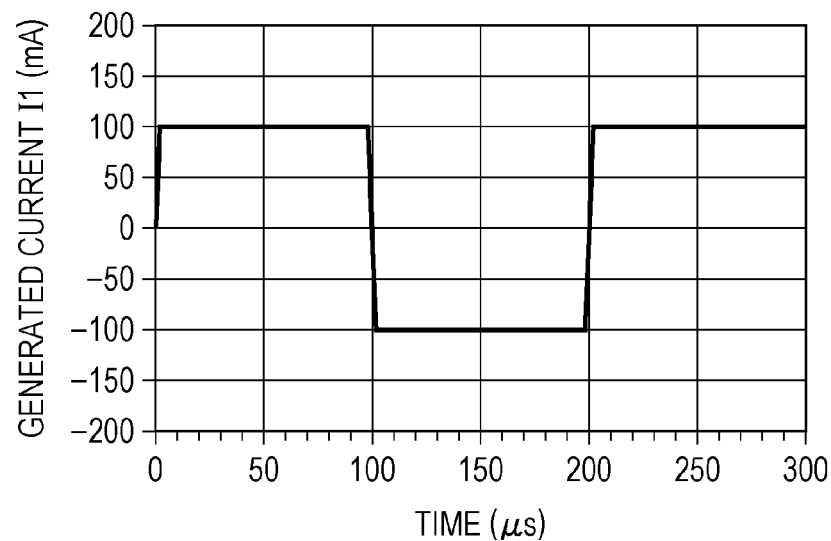
FIG. 8A is a graph illustrating one example of the waveform of a generated current according to a second reference mode.
Figure 8B:
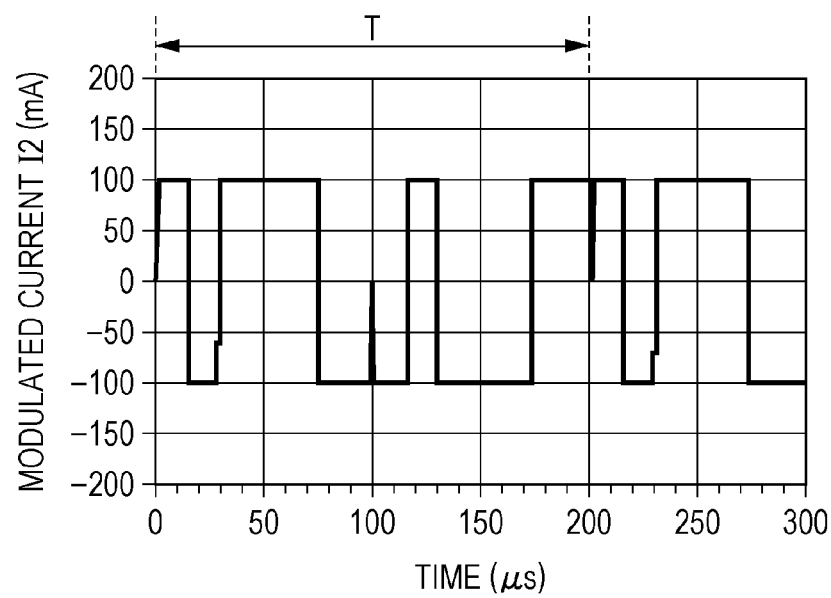
FIG. 8B is a graph illustrating one example of the waveform of a modulated current according to the second reference mode.
Figure 8C:
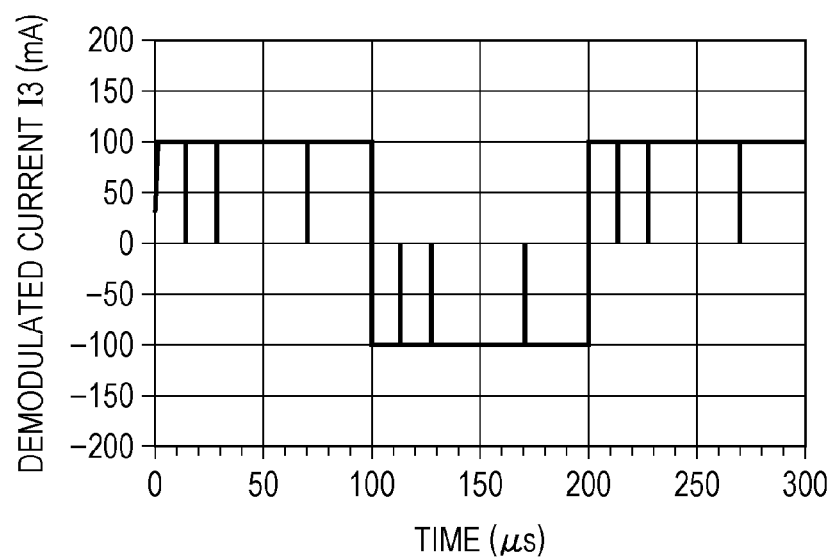
FIG. 8C is a graph illustrating one example of the waveform of a demodulated current according to the second reference mode.

FIGS. 8A to 8C illustrate examples of the waveforms of a generated current I1, a modulated current I2, and a demodulated current I3, respectively.

The generated current I1 illustrated in FIG. 8A was an AC having a rectangular waveform with a frequency of 5 kHz. The modulated current I2 illustrated in FIG. 8B was obtained by multiplying the generated current I1 by the modulation code M1. The modulated current I2 illustrated in FIG. 8B was an AC. The demodulated current I3 illustrated in FIG. 8C was obtained by multiplying the modulated current I2 by the demodulation code D1. The modulation code M1 and the demodulation code D1 were the same as those described in the first reference mode. As illustrated in FIG. 8C, an AC equivalent to the generated current I1 was restored as the demodulated current I3 through the code modulation and the code demodulation.

Accordingly, even when the generated power is AC power, the power can be transmitted with high transmission efficiency, as in the case in which the generated power is DC power.

[2. Code Modulator and Code Demodulator]

Figure 9:
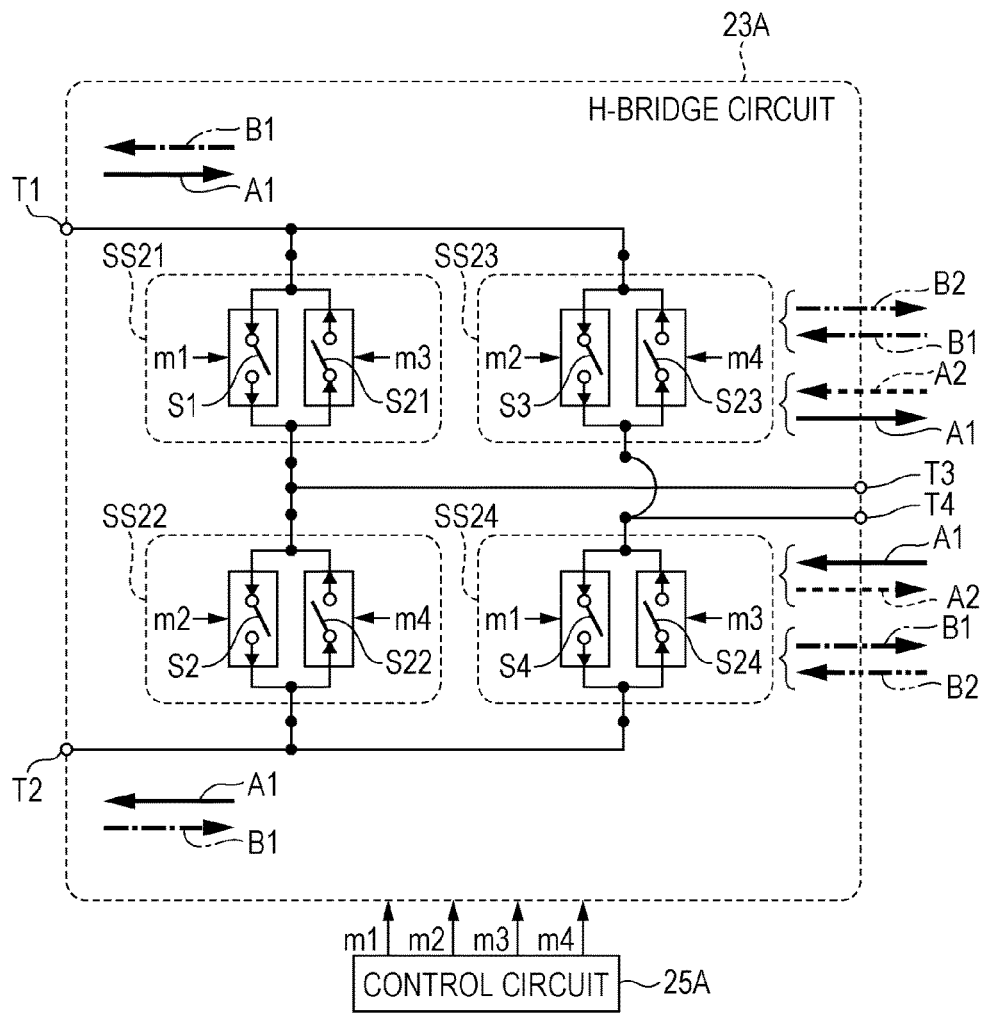
FIG. 9 is a schematic circuit diagram illustrating an example configuration of a code modulator according to the second reference mode.

FIG. 9 illustrates an example configuration of a control circuit 25A and an H-bridge circuit 23A in the code modulator 2 according to the second reference mode. The circuit illustrated in FIG. 9 differs from the circuit illustrated in FIG. 7 in the following points.

(1) The switch circuits SS1 to SS4 illustrated in FIG. 7 are replaced with bidirectional switch circuits SS21 to SS24.
(2) The control circuit 25 illustrated in FIG. 7 is replaced with the control circuit 25A. The control circuit 25A outputs code sequences m1 to m4 to the H-bridge circuit 23A as control signals.

The switch circuit SS21 includes, in addition to a switch S1 as illustrated in FIG. 7, a switch S21 connected in a direction opposite to and in parallel with the switch S1. The switch S21 is turned on or off in response to the control signal m3. The switch circuit SS22 includes, in addition to a switch S2 as illustrated in FIG. 7, a switch S22 connected in a direction opposite to and in parallel with the switch S2. The switch S22 is turned on or off in response to the control signal m4. The switch circuit SS23 includes, in addition to a switch S3 as illustrated in FIG. 7, a switch S23 connected in a direction opposite to and in parallel with the switch S3.

The switch S23 is turned on or off in response to the control signal m4. The switch circuit SS24 includes, in addition to a switch S4 as illustrated in FIG. 7, a switch S24 connected in a direction opposite to and in parallel with the switch S4. The switch S24 is turned on or off in response to the control signal m3.

The switches S21 to S24 are, for example, MOS transistors.

Figure 10:
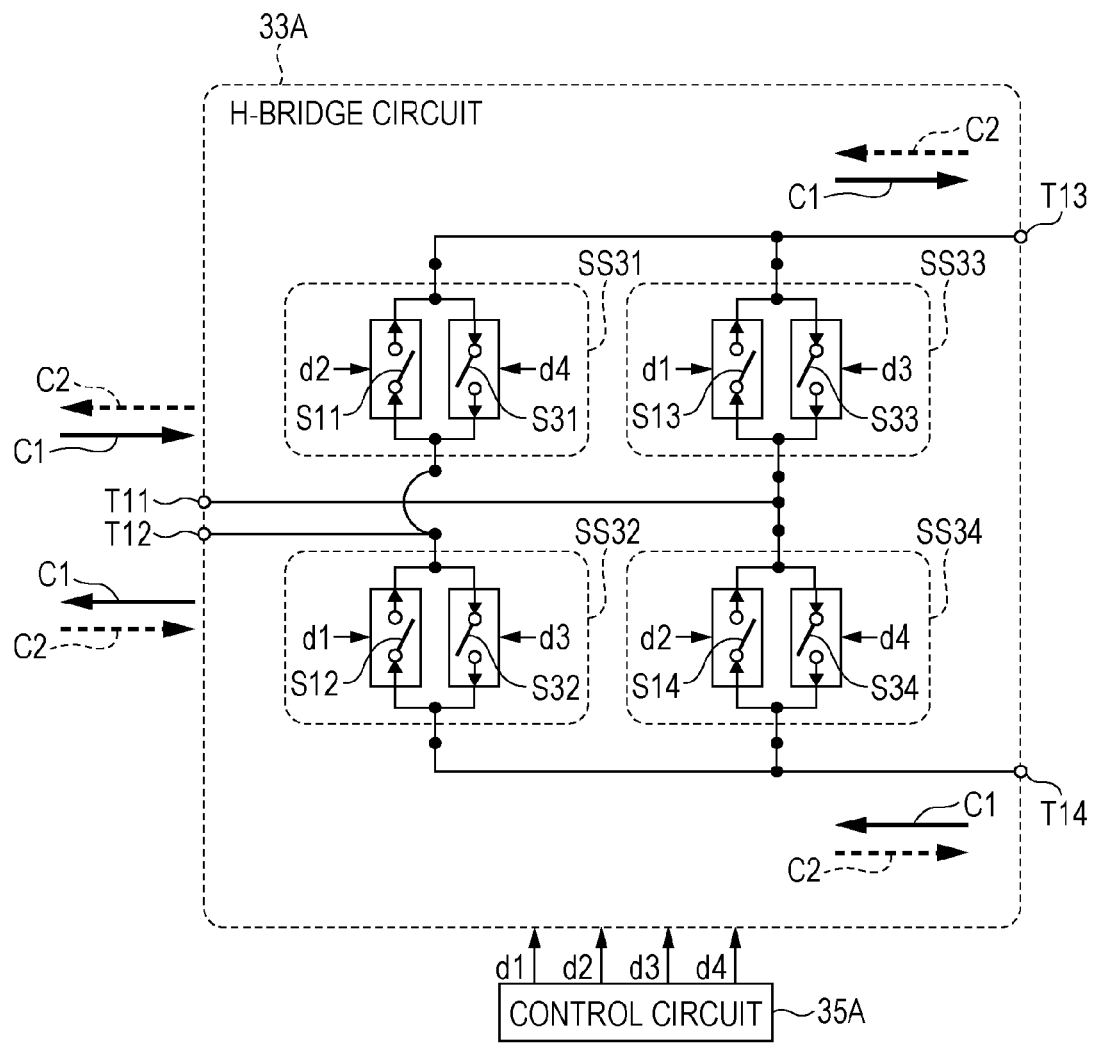
FIG. 10 is a schematic circuit diagram illustrating an example configuration of a code demodulator according to the second reference mode.

FIG. 10 illustrates an example configuration of a control circuit 35A and an H-bridge circuit 33A in the code demodulator 4 according to the second reference mode. The circuit illustrated in FIG. 10 differs from the circuit illustrated in FIG. 7 in the following points.

(1) The switch circuits SS11 to SS14 illustrated in FIG. 7 are replaced with bidirectional switch circuits SS31 to SS34.
(2) The control circuit 35 illustrated in FIG. 7 is replaced with the control circuit 35A. The control circuit 35A outputs code sequences d1 to d4 to the H-bridge circuit 33A as control signals.

The switch circuit SS31 includes, in addition to a switch S11 as illustrated in FIG. 7, a switch S31 connected in a direction opposite to and in parallel with the switch S11. The switch S31 is turned on or off in response to the control signal m4. The switch circuit SS32 includes, in addition to a switch S12 as illustrated in FIG. 7, a switch S32 connected in a direction opposite to and in parallel with the switch S12. The switch S32 is turned on or off in response to the control signal d3. The switch circuit SS33 includes, in addition to a switch S13 as illustrated in FIG. 7, a switch S33 connected in a direction opposite to and in parallel with the switch S13. The switch S33 is turned on or off in response to the control signal d3. The switch circuit SS34 includes, in addition to a switch S14 as illustrated in FIG. 7, a switch S34 connected in a direction opposite to and in parallel with the switch S14. The switch S34 is turned on or off in response to the control signal d4.

The switches S31 to S34 are, for example, MOS transistors.

[3. Operation]
[3-1. Control Signals]

Table 3 illustrates examples of the code sequences of the control signals m1 to m4 input to the switches S1 to S4 and S21 to S24 in the code modulator 2 and examples of the code sequences of the control signals d1 to d4 input to the switches S11 to S14 and S31 to S34 in the code demodulator 4.

TABLE 3

| CONTROL SIGNAL | CODE SEQUENCE |
|---|---|
| m1 | [c1a c0] = [1 0 1 1 1 0 0 0 0 0 0 0] |
| m2 | [c1b c0] = [0 1 0 0 0 1 1 0 0 0 0 0] |
| m3 | [c0 c1a] = [0 0 0 0 0 0 1 0 1 1 1 0 0] |
| m4 | [c0 c1b] = [0 0 0 0 0 0 0 1 0 0 0 1 1] |
| d1 | [c1a c0] = [1 0 1 1 1 0 0 0 0 0 0 0] |
| d2 | [c1b c0] = [0 1 0 0 0 1 1 0 0 0 0 0] |
| d3 | [c0 c1a] = [0 0 0 0 0 0 1 0 1 1 1 0 0] |
| d4 | [c0 c1b] = [0 0 0 0 0 0 0 1 0 0 0 1 1] |

In this example, the code sequences of the control signals m1, m2, m3, and m4 are the same as the code sequences of the control signals d1, d2, d3, and d4, respectively. In Table 3, the code sequence c1b is a code sequence obtained by inverting all bits of the code sequence c1a, and a code sequence c0 is a code sequence in which all bits are 0s. The time span of the code sequences c1a, c1b, and c0 match the half cycle of the AC generated current I1.

[3-2. Operation of Code Modulator]

A description will be given of the operation of the code modulator 2. Now, suppose a case in which the generated current I1 becomes positive in a first half cycle (i.e., a front half of one cycle) and becomes negative in a second half cycle (i.e., a last half of one cycle).

[3-2-1. Operation of Code Modulator in First Half Cycle]

In the first half cycle, the switches S1 to S4 are turned on or off in accordance with the control signals m1 and m2, and the switches S21 to S24 are maintained in the OFF state.

When the control signal m1 indicates "1", and the control signal m2 indicates "0", the switches S1 and S4 are in the ON state, and the switches S2 and S3 are in the OFF state. At this point in time, a positive generated current I1 flows in the direction indicated by arrow A1 in FIG. 9, so that a positive modulated current I2 flows to the terminals T3 and T4. That is, the generated current I1 is code-modulated with "1".

On the other hand, when the control signal m1 indicates "0", and the control signal m2 indicates "1", the switches S1 and S4 are in the OFF state, and the switches S2 and S3 are in the ON state. At this point in time, the positive generated current I1 flows in the direction indicated by arrow A2 in FIG. 9, so that a negative modulated current I2 flows to the terminals T3 and T4. That is, the generated current I1 is code-modulated with "−1".

Thus, in the first half cycle, the code modulator 2 outputs an AC modulated current I2 to the transmission path 3 via the terminals T3 and T4.

[3-2-2. Operation of Code Modulator in Second Half Cycle]

In the second half cycle, the switches S1 to S4 are maintained in the OFF state, and the switches S21 to S24 are turned on or off in accordance with the control signals m3 and m4.

When the control signal m3 indicates "1", and the control signal m4 indicates "0", the switches S21 and S24 are in the ON state, and the switches S22 and S24 are in the OFF state. At this point in time, a negative generated current I1 input to the code modulator 2 flows in the direction indicated by arrow B1 in FIG. 9, so that a negative modulated current I2 flows to the terminals T3 and T4. That is, the generated current I1 is code-modulated with "1".

On the other hand, when the control signal m3 indicates "0", and the control signal m4 indicates "1", the switches S21 and S24 are in the OFF state, and the switches S22 and S23 are in the ON state. At this point in time, a negative generated current I1 input to the code modulator 2 flows in the direction indicated by arrow B2 in FIG. 9, so that a positive modulated current I2 flows to the terminals T3 and T4. That is, the generated current I1 is code-modulated with "−1".

Accordingly, in the second half cycle, the code modulator 2 also outputs an AC modulated current I2 to the transmission path 3 via the terminals T3 and T4.

[3-2-3. Supplement]

The series of switching operations based on the control signals m1 to m4 illustrated in Table 2 corresponds to an operation for code modulating the generated current I1 with the modulation code Mb given by:

$$Mb = [1\ -1\ 1\ 1\ 1\ -1\ -1\ 1\ -1\ 1\ 1\ 1\ -1\ -1] \quad (6)$$

In the modulation code Mb, the number of 1s is larger than the number of −1s. However, the average of the modulated current I2 can become 0. This is because the generated current I1 is positive in the first half cycle and is negative in the second half cycle, and a partial sequence of the modulation code Mb in the first half cycle and a partial sequence of the modulation code Mb in the second half cycle are the same.

[3-3. Operation of Code Demodulator]

A description will be given of the operation of the code demodulator 4.

[3-3-1. Operation of Code Demodulator in First Half Cycle]

In the first half cycle, the switches S11 to S14 are turned on or off in accordance with the control signals d1 and d2, and the switches S31 to S34 are maintained in the OFF state.

When a positive modulated current I2 is input to the code demodulator 4 in the first half cycle, the control signal d1 indicates "1", and the control signal d2 indicates "0". At this point in time, the switches S12 and S13 are in the ON state, and the switches S11 and S14 are in the OFF state. Thus, the positive modulated current I2 flows in the direction indicated by arrow C1 in FIG. 10, and a positive demodulated current I3 flows to the terminals T13 and T14. That is, the modulated current I2 is code-demodulated with "1".

In the first half cycle, when the negative modulated current I2 is input to the code demodulator 4, the control signal d1 indicates "0", and the control signal d2 indicates "1". At this point in time, the switches S12 and S13 are in the OFF state, and the switches S11 and S14 are in the ON state. Thus, a negative modulated current I2 flows in the direction indicated by arrow C1 in FIG. 10, and a positive demodulated current I3 flows to the terminals T13 and T14. That is, the modulated current I2 is code-demodulated with "−1".

Thus, the code demodulator 4 outputs the positive demodulated current I3 via the terminals T13 and T14 in the first half cycle.

[3-3-2. Operation of Code Demodulator in Second Half Cycle]

In the second half cycle, the switches S11 to S14 are maintained in the OFF state, and the switches S31 to S34 are turned on or off in accordance with the control signals d3 and d4.

In the second half cycle, when a positive modulated current I2 is input to the code demodulator 4, the control signal d3 indicates "1", and the control signal d4 indicates "0". At this point in time, the switches S32 and S33 are in the ON state, and the switches S31 and S34 are in the OFF state. Thus, the positive modulated current I2 flows in the direction indicated by arrow C2 in FIG. 10, and a negative demodulated current I3 flows to the terminals T13 and T14. That is, the modulated current I2 is code-demodulated with "−1".

In the second half cycle, when the negative modulated current I2 is input to the code demodulator 4, the control signal d3 indicates "0", and the control signal d4 indicates "1". At this point in time, the switches S32 and S33 are in the OFF state, and the switches S31 and S34 are in the ON state. Thus, a negative modulated current I2 flows in the direction indicated by arrow C2 in FIG. 10, and a negative demodulated current I3 flows to the terminals T13 and T14. That is, the modulated current I2 is code-demodulated with "1".

Accordingly, the code demodulator 4 outputs the negative demodulated current I3 via the terminals T13 and T14 in the second half cycle. In other words, the code demodulator 4 generates, as the demodulated current I3, an AC that is positive in the first half cycle and is negative in the second half cycle, and the waveform of the AC generally matches the waveform of the generated current I1.

[3-3-3. Supplement]

The series of switching operations based on the control signals d1 to d4 illustrated in Table 2 corresponds to an operation of code-demodulating the modulated current I2 with the demodulation code Db:

$$Db=[1\ -1\ 1\ 1\ 1\ -1\ -1\ 1\ -1\ 1\ 1\ 1\ -1\ -1] \quad (7)$$

[4. Modification of Operation]

Table 4 illustrates other examples of the code sequences of the control signals m1 to m4 input to the switches S1 to S4 and S21 to S24 in the code modulator 2 and other examples of the code sequences of the control signals d1 to d4 input to switches S11 to S14 and S31 to S34 in the code demodulator 4.

TABLE 4

| CONTROL SIGNAL | CODE SEQUENCE |
| --- | --- |
| m1 | [c1a c1b] = [1 0 1 1 1 0 0 0 1 0 0 0 1 1] |
| m2 | [c1b c1a] = [0 1 0 0 0 1 1 1 0 1 1 1 0 0] |
| m3 | [ c0 c0 ] = [0 0 0 0 0 0 0 0 0 0 0 0 0 0] |
| m4 | [ c0 c0 ] = [0 0 0 0 0 0 0 0 0 0 0 0 0 0] |
| d1 | [c1a c1b] = [1 0 1 1 1 0 0 0 1 0 0 0 1 1] |
| d2 | [c1b c1a] = [0 1 0 0 0 1 1 1 0 1 1 1 0 0] |
| d3 | [ c0 c0 ] = [0 0 0 0 0 0 0 0 0 0 0 0 0 0] |
| d4 | [ c0 c0 ] = [0 0 0 0 0 0 0 0 0 0 0 0 0 0] |

The control signals m3, m4, d3, and d4 illustrated in Table 4 maintain the switches S21 to S24 and S31 to S34 in the OFF state. Thus, the H-bridge circuit 23A illustrated in FIG. 9 and the H-bridge circuit 33A illustrated in FIG. 10 are the substantially the same as the H-bridge circuit 23 and the H-bridge circuit 33, respectively, illustrated in FIG. 7.

In addition, the control signals m1, m2, d1, and d2 illustrated in Table 4 are the same as the control signals m1, m2, d1, and d2 illustrated in Table 2. Thus, the code modulator 2 and the code demodulator 4 in this reference mode can realize DC-power modulation and demodulation like those described above in the first reference mode.

Accordingly, when the control signals are modified, the code modulator and the code demodulator according to this reference mode can deal with both DC-power modulation and demodulation and AC-power modulation and demodulation.

When the electric generator 1 generates DC power, it may be, for example, a photovoltaic generator. When the electric generator 1 generates AC power, it may be, for example, an electric generator utilizing turbine rotation. Examples of such an electric generator include a fossil-fuel power station, a hydropower station, a wind power generator, a nuclear power station, and a tidal power station.

[5. Modifications of Code Modulator and Code Demodulator]

Figure 11:
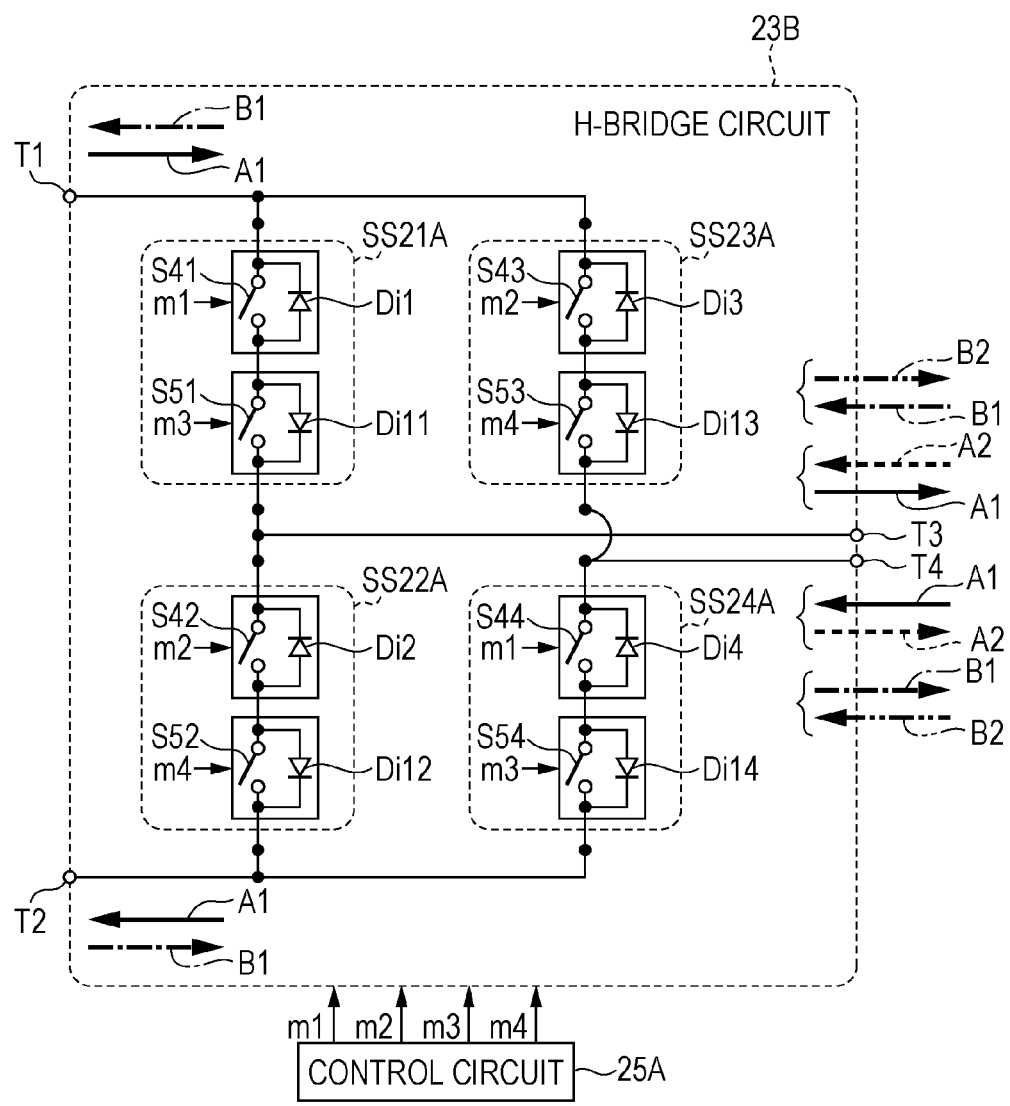
FIG. 11 is a schematic circuit diagram illustrating the configuration of a code modulator according to a modification of the second reference mode.

FIG. 11 illustrates a modification of an H-bridge circuit 23B in the code modulator 2 according to the second reference mode. The H-bridge circuit 23B illustrated in FIG. 11 includes bidirectional switch circuits SS21A to SS24A in place of the bidirectional switch circuits SS21 to SS24 illustrated in FIG. 9.

The bidirectional switch circuit SS21A includes switches S41 and S51 and diodes Di1 and Di11. The switches S41 and S51 are connected in series with each other. The diode Di1 is connected in parallel with the switch S41. The diode Di11 is connected in parallel with the switch S51. The diode Di1 passes current from a terminal T3 to a terminal T1. The diode Di11 passes current from the terminal T1 to the terminal T3. Since the bidirectional switch circuits SS22A to 5524A have structures that are the same as or similar to that of the bidirectional switch circuit SS21A, descriptions thereof are not given hereinafter.

The control circuit 25A outputs a control signal m1 to the switches S41 and S44, outputs a control signal m2 to the switches S42 and S43, outputs a control signal m3 to the switches S51 and S54, and outputs a control signal m4 to the switches S52 and S53. The control signals m1 to m4 may be, for example, the control signals illustrated in Table 3.

Figure 12:
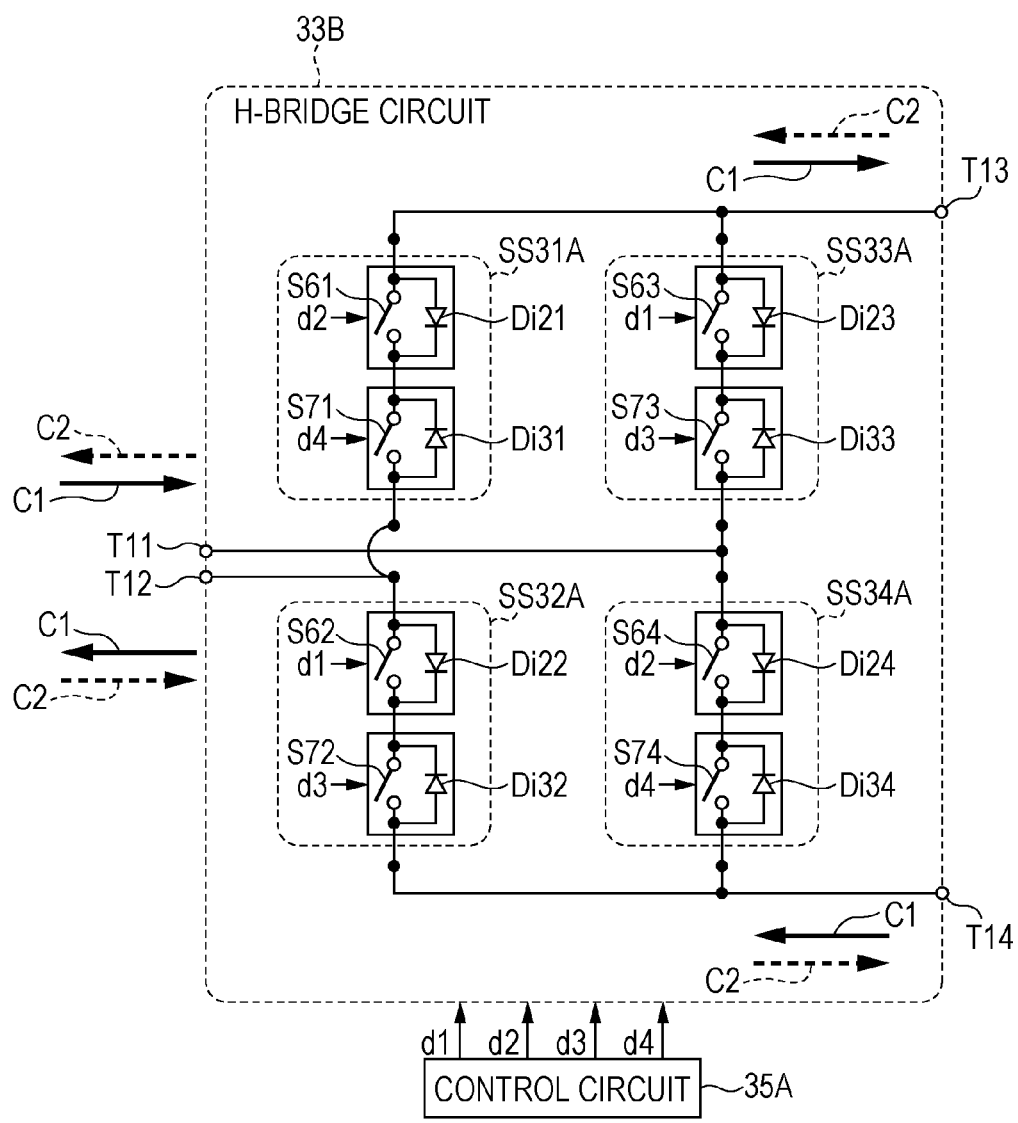
FIG. 12 is a schematic circuit diagram illustrating the configuration of a code demodulator according to a modification of the second reference mode.

FIG. 12 illustrates a modification of an H-bridge circuit 33B in the code demodulator 4 according to the second reference mode. The H-bridge circuit 33B illustrated in FIG. 12 includes bidirectional switch circuits SS31A to SS34A in place of the bidirectional switch circuits SS31 to SS34 illustrated in FIG. 10.

The bidirectional switch circuit SS31A includes switches S61 and S71 and diodes Di21 and Di31. The switches S61 and S71 are connected in series with each other. The diode Di21 is connected in parallel with the switch S61. The diode Di31 is connected in parallel with the switch S71. The diode Di21 passes current from a terminal T13 to a terminal T12. The diode Di31 passes current from the terminal T12 to the terminal T13. Since bidirectional switch circuits SS32A to SS34A have structures that are same as or similar to that of the bidirectional switch circuit SS31A, descriptions thereof are not given hereinafter.

The control circuit 35A outputs a control signal d1 to switches S62 and S63, outputs a control signal d2 to the switches S61 and S64, outputs a control signal d3 to switches S72 and S73, and outputs a control signal d4 to the switches S71 and S74. The control signals d1 to d4 may be, for example, those illustrated in Table 3.

The switches S41 to S44, S51 to S54, S61 to S64, and S71 to S74 may be, for example, MOS transistors. In this case, the diodes Di1 to Di4, Di11 to Di14, Di21 to Di24, and Di31 to Di34 may be, for example, body diodes of the MOS transistors. This makes it possible to miniaturize the bidirectional switches SS21A to SS24A and SS31A to 5534A.

First Embodiment

The following description will be given of a first embodiment, particularly, points that are different from both the first and second reference modes.

[1. Power Transmission System]

Figure 13:
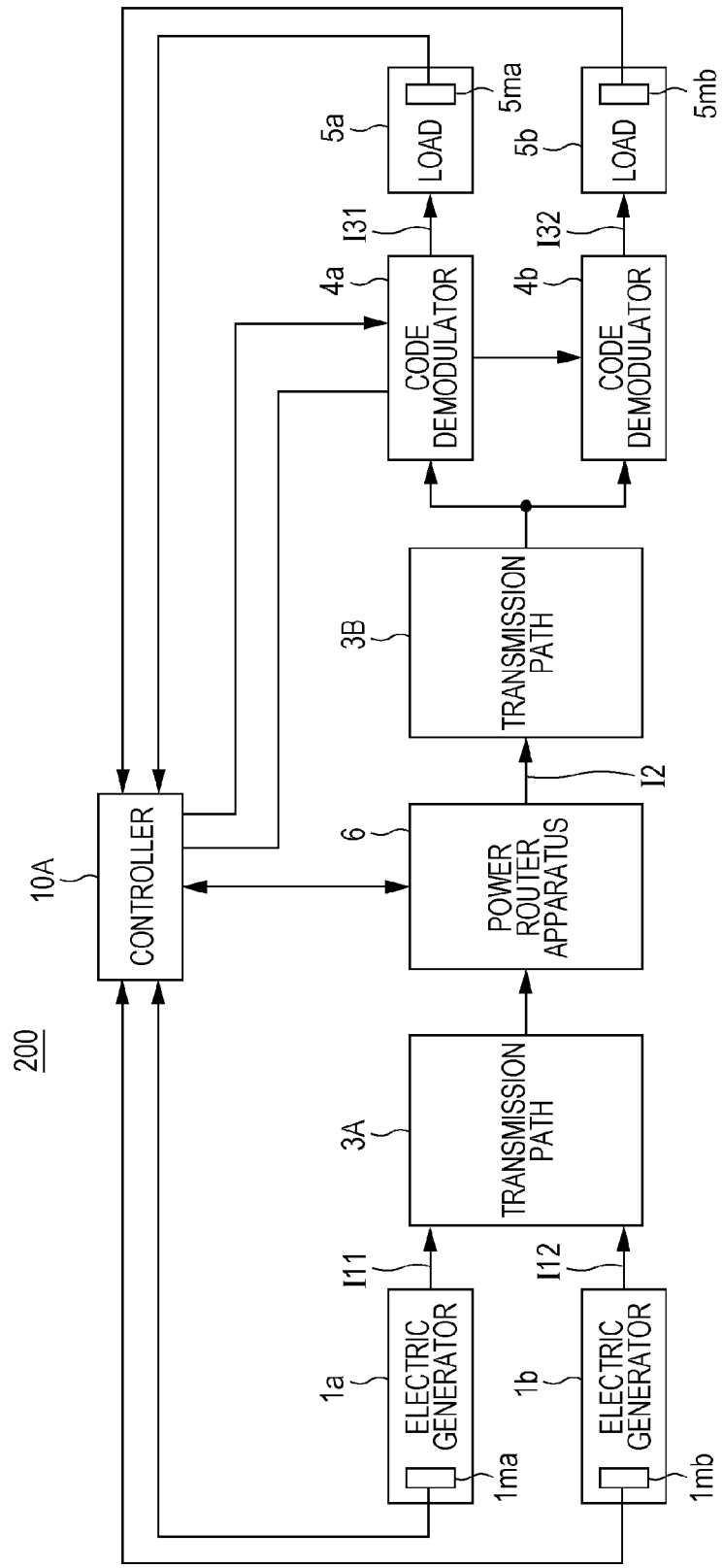
FIG. 13 is a block diagram illustrating an example configuration of a power transmission system according to a first embodiment.

FIG. 13 illustrates an example configuration of a power transmission system 200 according to the first embodiment.

The power transmission system 200 illustrated in FIG. 13 includes electric generators 1a and 1 b, transmission paths 3A and 3B, a power router apparatus 6, code demodulators 4a and 4b, and loads 5a and 5b. The electric generators 1a and 1 b include power measuring instruments 1ma and 1mb, respectively. The loads 5a and 5b include power measuring instruments 5ma and 5mb, respectively.

The power measuring instrument 1ma measures the amount of power generated by the electric generator 1a and transmits information about the measured amount of power to a controller 10A. The power measuring instrument 1mb measures the amount of power generated by the electric generator 1b and transmits information about the measured amount of power to the controller 10A.

The power measuring instrument 5ma measures the amount of power consumed by the load 5a and transmits information about the measured amount of power to the controller 10A. The power measuring instrument 5mb measures the amount of power consumed by the load 5b and transmits information about the measured amount of power to the controller 10A.

Based on the information about those amounts of power, the controller 10A generates instruction signals for the power router apparatus 6 and the code demodulators 4a and 4b. The instruction signals include, for example, a synchronization signal for making the operations of code modulators 43a and 43b and the operations of the code demodulators 4a and 4b in the power router apparatus 6 synchronize each other. The instruction signals transmitted to the power router apparatus 6 include, for example, code information regarding a modulation code. The instruction signals transmitted to the code demodulators 4a and 4b include, for example, code information regarding a demodulation code. The instruction signals transmitted to the power router apparatus 6 may further include information regarding power division. The power division is set, for example, through reflection of powers requested by the loads 5a and 5b.

The power generated by the electric generator 1a and the power generated by the electric generator 1b are transmitted to the power router apparatus 6 through the transmission path 3A. Each generated power is, for example, DC power or AC power.

The power router apparatus 6 code-modulates the generated powers on the basis of the instruction signals from the controller 10A. The code-modulated powers are combined, and the combined power is transmitted to the code demodulators 4a and 4b through the transmission path 3B.

On the basis of the instruction signals from the controller 10A, each of the code demodulators 4a and 4b code-demodulates the code-modulated power to generate code-demodulated power.

Each of the loads 5a and 5b receives the corresponding code-demodulated power.

[2. Power Router Apparatus]

FIG. 14 illustrates an example configuration of the power router apparatus 6.

In FIG. 14, the power router apparatus 6 includes a control circuit 40, a communication circuit 41, a power divider 42, and code modulators 43a and 43b.

The communication circuit 41 receives the instruction signals from the controller 10A and outputs the received instruction signals to the control circuit 40.

On the basis of the power division information in the instruction signals, the control circuit 40 causes the power divider 42 to set a power dividing ratio.

On the basis of the code information in the instruction signals, the control circuit 40 generates a plurality of control signals according to a first modulation code and outputs the control signals to the code modulator 43a. Similarly, on the basis of the code information in the instruction signals, the control circuit 40 generates a plurality of control signals according to a second modulation code and outputs the control signals to the code modulator 43b.

The power divider 42 divides power input via a terminal T21 into first divided power and second divided power by using the set dividing ratio, outputs the first divided power to the code modulator 43a, and outputs the second divided power to the code modulator 43b. The power divider 42 may have, for example, a resistance dividing circuit. The resistance dividing circuit has, for example, an input port and two branched output ports, that is, first and second output ports. In this case, power can be divided in accordance with the ratio of the value of resistance between the input port and the first output port to the value of resistance between the input port and the second output port. Alternatively, when the input power is AC power, the power divider 42 may have a transformer for power division. The transformer has, for example, an input-side coil and two output-side coils that couple with the input-side coil. In this case, power can be divided in accordance with the ratio of a coefficient of coupling between the input-side coil and the first output-side coil to a coefficient of coupling between the input-side coil and the second output-side coil.

The code modulators 43a and 43b are driven on the basis of the respective control signals. The code modulator 43a code-modulates the first divided power with the first modulation code to generate first code-modulated power. The code modulator 43b code-modulates the second divided power with the second modulation code to generate second code-modulated power. The first and second code-modulated powers are combined, and the combined power is transmitted to the transmission path 3B via a terminal T22.

[3. Operation]

A description will be given of various example operations of the code modulators 43a and 43b in the power router apparatus 6 and the code demodulators 4a and 4b. In the example described below, each of the code modulators 43a and 43b has the configuration illustrated in FIG. 9, and each of the code demodulators 4a and 4b has the configuration illustrated in FIG. 10.

[3-1. Code Modulation and Demodulation of DC Powers]

In a first example operation, two DCs were code-modulated into two code-modulated currents, respectively, and the two code-modulated currents were code-demodulated into two DCs, respectively.

In this example operation, control signals m1 to m4 input to the code modulator 43a and control signals d1 to d4 input to the code demodulator 4a had the code sequences illustrated in Table 4 described above. Control signals m1 to m4 input to the code modulator 43b and control signals d1 to d4 input to the code demodulator 4b had the code sequences illustrated in Table 5 below.

TABLE 5

| CONTROL SIGNAL | CODE SEQUENCE |
| --- | --- |
| m1 | [c2a c2b] = [1 1 1 0 0 1 0 0 0 1 1 0 1] |
| m2 | [c2b c2a] = [0 0 0 1 1 0 1 1 1 1 0 0 1 0] |
| m3 | [ c0 c0 ] = [0 0 0 0 0 0 0 0 0 0 0 0 0 0] |
| m4 | [ c0 c0 ] = [0 0 0 0 0 0 0 0 0 0 0 0 0 0] |
| d1 | [c2a c2b] = [1 1 1 0 0 1 0 0 0 1 1 0 1] |
| d2 | [c2b c2a] = [0 0 0 1 1 0 1 1 1 1 0 0 1 0] |
| d3 | [ c0 c0 ] = [0 0 0 0 0 0 0 0 0 0 0 0 0 0] |
| d4 | [ c0 c0 ] = [0 0 0 0 0 0 0 0 0 0 0 0 0 0] |

Since the operations of the code modulator 43a and the code demodulator 4a have been described above, descriptions thereof are not given hereinafter. Also, since operations of the code modulator 43b and the code demodulator 4b are substantially the same as those described above except that the control signals are different, descriptions of the operations are not given hereinafter.

As illustrated in Tables 4 and 5, the code sequence c1a and a code sequence c2a were different from each other, and the code sequence c1b and a code sequence c2b were different from each other. The code sequence c1a and the code sequence c2a were orthogonal to each other, and the code sequence c1b and the code sequence c2b were orthogonal to each other. More specifically, the code sequence c1a and the code sequence c2a were 7-bit orthogonal Gold sequences different from each other, and the code sequence c1b and the code sequence c2b were 7-bit orthogonal Gold sequences different from each other.

FIGS. 15A, 15B, 15C, 15D, and 15E illustrate the waveforms of an input current I11A, an input current I12A, a modulated current I2, a demodulated current I31, and a demodulated current I32, respectively, illustrated in FIGS. 13 and 14. In this case, the modulated current I2 corresponds to a combined current obtained by combining a modulated current output from the code modulator 43a and a modulated current output from the code modulator 43b. In this case, it was assumed that a generated current I11 and the input current I11A were equal to each other, and a generated current I12 and the input current I12A were equal to each other.

In this example operation, a current requested by the load 5a was a DC of 100 mA, and a current requested by the load 5b was a DC of 50 mA.

Figure 15A:
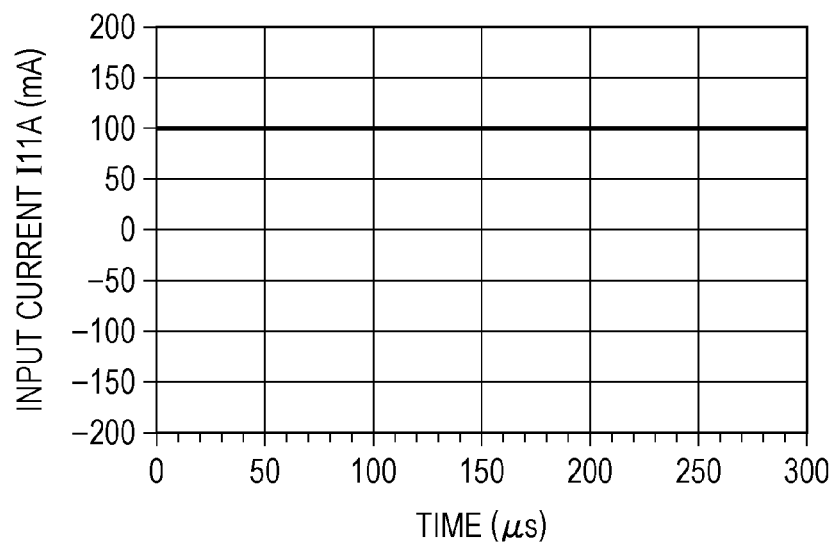
FIG. 15A is a graph illustrating the waveform of a first input current according to a first example operation in the first embodiment.
Figure 15B:
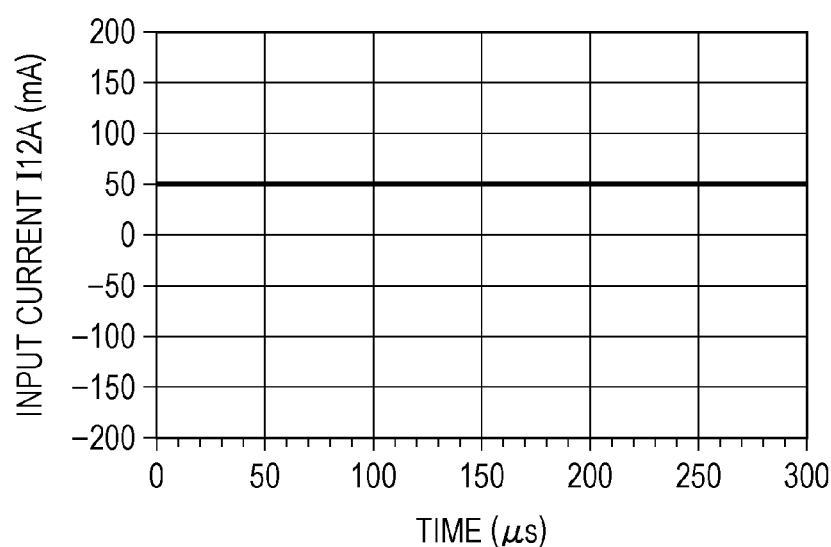
FIG. 15B is a graph illustrating the waveform of a second input current according to the first example operation in the first embodiment.

The input current I11A illustrated in FIG. 15A was a DC of 100 mA, and the input current I12A illustrated in FIG. 15B was a DC of 50 mA. The modulated current I2 illustrated in FIG. 15C was an AC that varies in the range of −150 mA to 150 mA. The demodulated current I31 illustrated in FIG. 15D was a DC of 100 mA, and the demodulated current I32 illustrated in FIG. 15E was a DC of 50 mA.

Figure 15C:
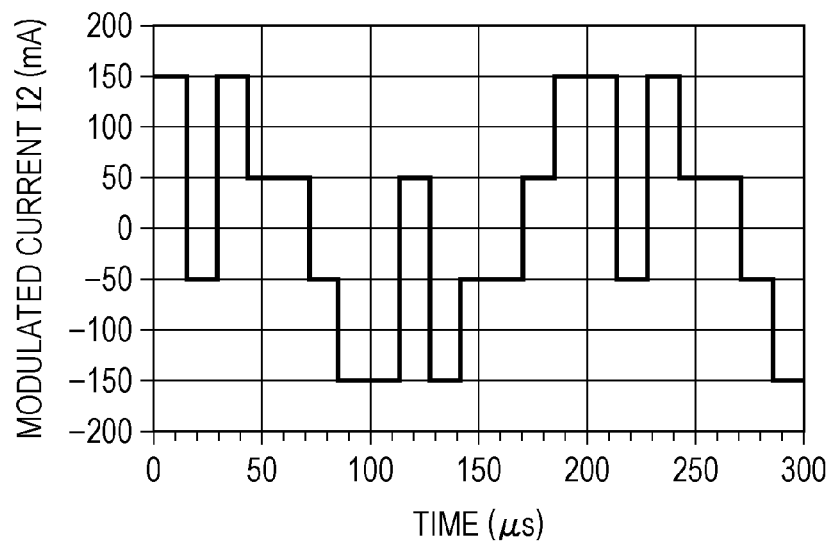
FIG. 15C is a graph illustrating the waveform of a modulated current according to the first example operation in the first embodiment.
Figure 15D:
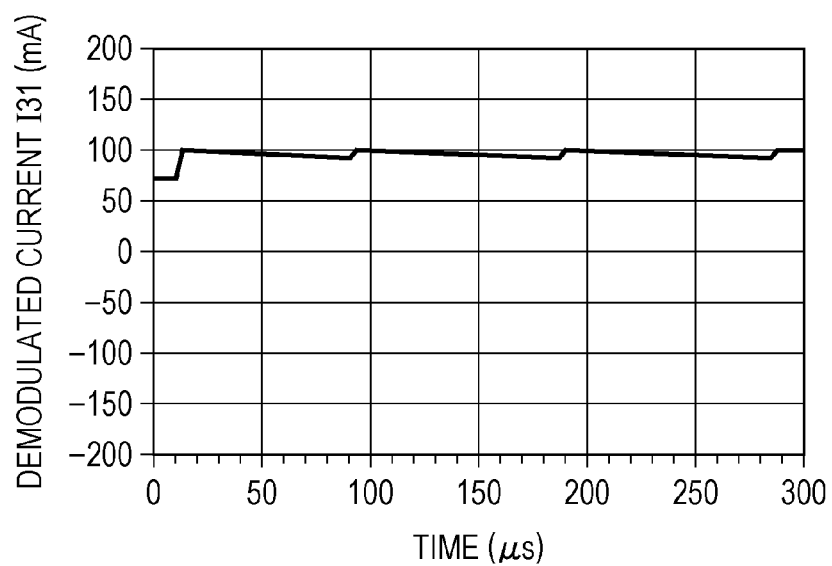
FIG. 15D is a graph illustrating the waveform of a first demodulated current according to the first example operation in the first embodiment.

Comparison between FIG. 15A and FIG. 15D shows that the DC I11 generated by the electric generator 1a was transmitted to the load 5a through the code modulation and demodulation. Comparison between FIG. 15B and FIG. 15E shows that the DC I12 generated by the electric generator 1b was transmitted to the load 5b through the code modulation and demodulation.

The series of switching operations in which the code modulator 43a performed based on the control signals m1 to m4 illustrated in Table 4 corresponds to an operation for code-modulating the input current I11A with the modulation code M1 described above. The series of switching operations in which the code demodulator 4a performed based on the control signals d1 to d4 illustrated in Table 4 corresponds to an operation for code-modulating the modulated current I2 with the demodulation code D1 described above. The series of switching operations in which the code modulator 43b performed based on the input current I12A illustrated in Table 5 corresponds to an operation for code-modulating the control signals m1 to m4 with the modulation code M2 described below. The series of switching operations in which the code demodulator 4b performed based on the control signals d1 to d4 illustrated in Table 5 corresponds to an operation for code-modulating the modulated current I2 with the demodulation code D2 described below.

$$M2=[1\ 1\ 1\ -1\ -1\ 1\ -1\ -1\ -1\ -1\ 1\ 1\ -1\ 1] \quad (8)$$

$$D2=[1\ 1\ 1\ -1\ -1\ 1\ -1\ -1\ -1\ -1\ 1\ 1\ -1\ 1] \quad (9)$$

In this case, the front half of the code sequence of the modulation code M1 and the front half of the code sequence of the modulation code M2 are orthogonal Gold sequences that are orthogonal to each other. The last half of the code sequence of the modulation code M1 and the last half of the code sequence of the modulation code M2 are orthogonal Gold sequences that are orthogonal to each other. The front half of the code sequence of the demodulation code D1 and the front half of the code sequence of the demodulation code D2 are orthogonal Gold sequences that are orthogonal to each other. The last half of the code sequence of the demodulation code D1 and the last half of the code sequence of the demodulation code D2 are orthogonal Gold sequences that are orthogonal to each other.

Accordingly, results illustrated in FIGS. 15A to 15E indicate advantages described below.

(A) Since the modulation code include the orthogonal codes, a plurality of modulated powers can be concurrently transmitted through the same transmission path.

(B) Since the demodulation code include the orthogonal codes, a plurality of modulated powers concurrently transmitted through the same transmission path can be appropriately split.

With the arrangement described above, the power transmission system 200 allows a plurality of DC powers to be concurrently and independently transmitted.

[3-2. Code Modulation and Demodulation of Plurality of AC Powers]

In a second example operation, two ACs were code-modulated into two code-modulated currents, respectively, and then the two code-modulated currents were code-demodulated into two ACs, respectively.

In this example operation, control signals m1 to m4 input to the code modulator 43a and control signals d1 to d4 input to the code demodulator 4a had the code sequences illustrated in Table 3 described above. Control signals m1 to m4 input to the code modulator 43b and control signals d1 to d4 input to the code demodulator 4b had code sequences illustrated in Table 6 below.

TABLE 6

| CONTROL | SIGNAL CODE SEQUENCE |
| --- | --- |
| m1 | [c2a c0] = [1 1 1 0 0 1 0 0 0 0 0 0 0 0] |
| m2 | [c2b c0] = [0 0 0 1 1 0 1 0 0 0 0 0 0 0] |
| m3 | [c0 c2a] = [0 0 0 0 0 0 0 1 1 1 0 0 1 0] |
| m4 | [c0 c2b] = [0 0 0 0 0 0 0 0 0 0 1 1 0 1] |
| d1 | [c2a c0] = [1 1 1 0 0 1 0 0 0 0 0 0 0 0] |
| d2 | [c2b c0] = [0 0 0 1 1 0 1 0 0 0 0 0 0 0] |
| d3 | [c0 c2a] = [0 0 0 0 0 0 0 1 1 1 0 0 1 0] |
| d4 | [c0 c2b] = [0 0 0 0 0 0 0 0 0 0 1 1 0 1] |

Since the operations of the code modulator 43a and the code demodulator 4a have been described above, descriptions thereof are not given hereinafter. Also, since operations of the code modulator 43b and the code demodulator 4b are substantially the same as those described above except that the control signals are different, descriptions of the operations are not given hereinafter.

FIGS. 16A, 16B, 16C, 16D, and 16E illustrate the waveforms of an input current I11A, an input current I12A, a modulated current I2, a demodulated current I31, and a demodulated current I32, respectively.

Figure 16A:
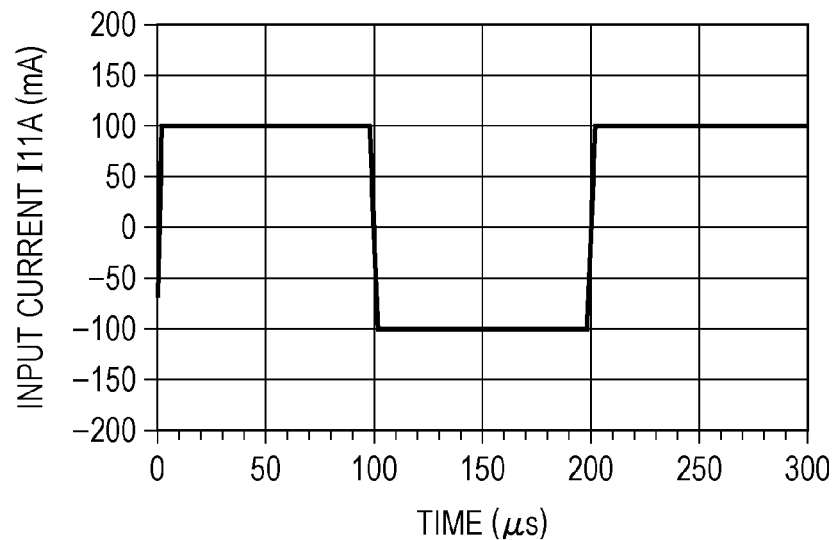
FIG. 16A is a graph illustrating the waveform of a first input current according to a second example operation in the first embodiment.
Figure 16B:
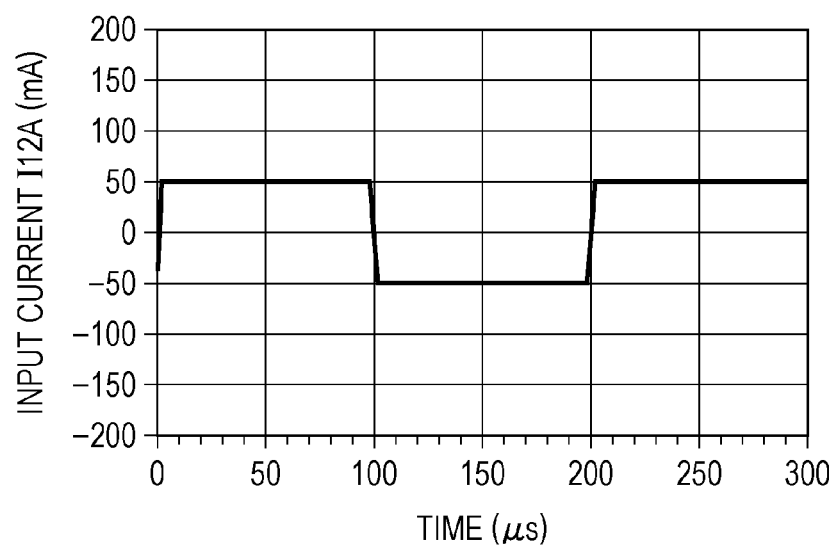
FIG. 16B is a graph illustrating the waveform of a second input current according to the second example operation in the first embodiment.
Figure 16C:
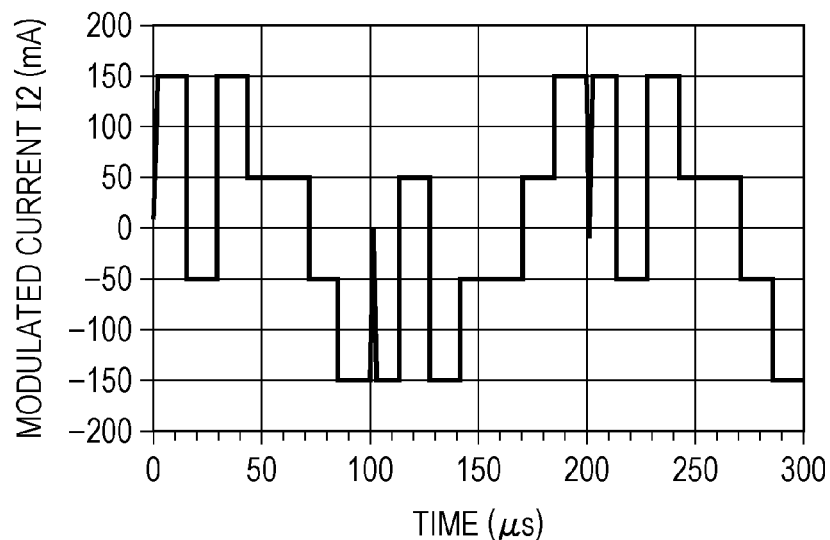
FIG. 16C is a graph illustrating the waveform of a modulated current according to the second example operation in the first embodiment.
Figure 16D:
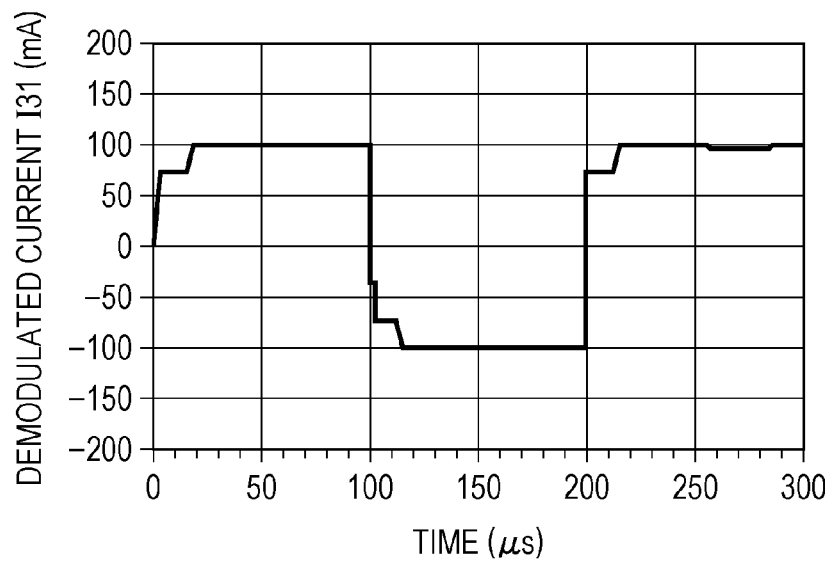
FIG. 16D is a graph illustrating the waveform of a first demodulated current according to the second example operation in the first embodiment.
Figure 16E:
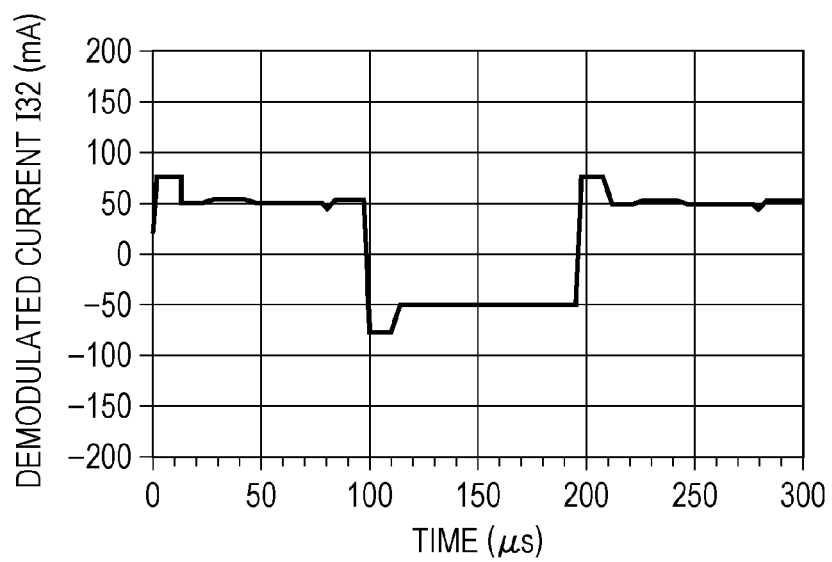
FIG. 16E is a graph illustrating the waveform of a second demodulated current according to the second example operation in the first embodiment.

Comparison between FIG. 16A and FIG. 16D shows that an AC I11 generated by the electric generator 1a was transmitted to the load 5a through the code modulation and demodulation. Comparison between FIG. 16B and FIG. 16E shows that an AC I12 generated by the electric generator 1b was transmitted to the load 5b through the code modulation and demodulation.

With the arrangement described above, the power transmission system 200 allows a plurality of AC powers to be concurrently and independently transmitted.

[3-3. Code Modulation and Demodulation Involving DC-AC Conversion]

In a third example operation, two DCs were code-modulated into two code-modulated currents, one of the code-modulated currents was then code-demodulated into a DC, and the other code-modulated current was converted into a predetermined AC.

In this example operation, control signals m1 to m4 input to the code modulator 43a and control signals d1 to d4 input to the code demodulator 4a had the code sequences illustrated in Table 4 described above. Control signals m1 to m4 input to the code modulator 43b had the code sequences illustrated in Table 5 described above. Control signals d1 to d4 input to the code demodulator 4b had the code sequences illustrated in Table 6 described above.

Figure 17A:
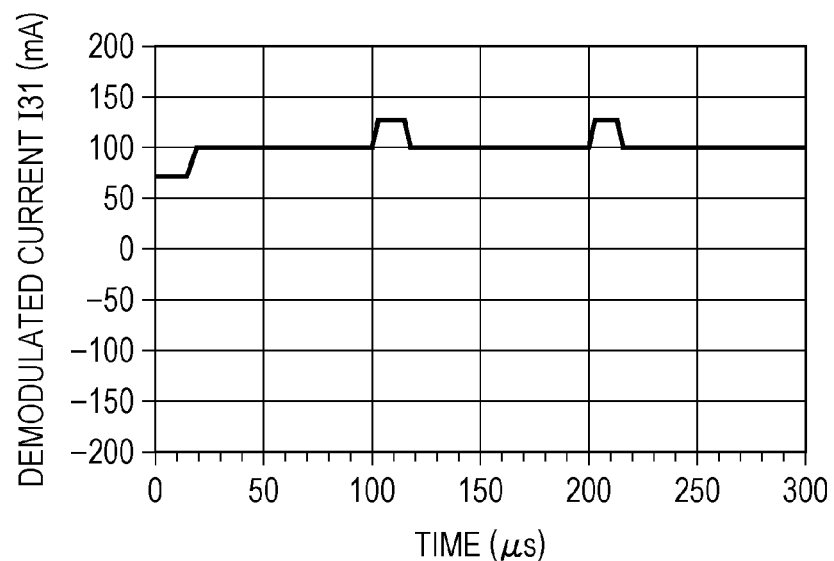
FIG. 17A is a graph illustrating the waveform of a demodulated current according to a third example operation in the first embodiment.
Figure 17B:
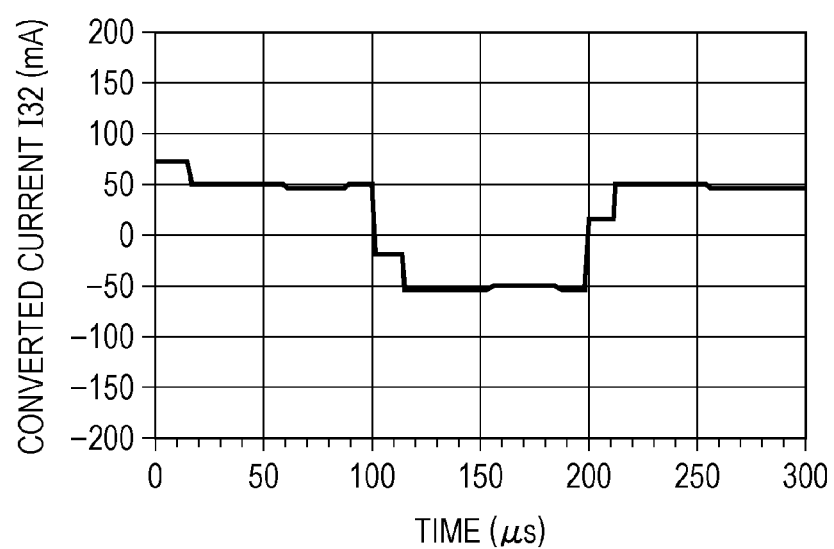
FIG. 17B is a graph illustrating the waveform of a converted current according to the third example operation in the first embodiment.

The waveforms of an input current I11A, an input current I12A, and a modulated current I2 were analogous to the waveforms illustrated in FIGS. 15A, 15B, and 15C, respectively. FIG. 17A and FIG. 17B illustrate the waveform of a demodulated current I31 and the waveform of a converted current I32, respectively.

Comparison between FIG. 15A and FIG. 17A shows that a DC I11 generated by the electric generator 1a was transmitted to the load 5a through the code modulation and demodulation. Comparison between FIG. 15B and FIG. 17B shows that a DC I12 generated by the electric generator 1b was transmitted to the load 5b as the AC I32 through the code modulation and predetermined conversion.

In this example operation, the series of switching operations in the code demodulator 4b corresponds to an operation for converting a modulated current, modulated with the modulation code M2, with conversion code Dc (noted below) generated based on the modulation code M2.

$$Dc=[1\ 1\ 1\ -1\ -1\ 1\ -1\ 1\ 1\ 1\ -1\ -1\ 1\ 1\ -1] \quad (10)$$

The code sequence of the conversion code Dc in the first half cycle is the same as the code sequence of the demodulation code D2 in the first half cycle, and the code sequence of the conversion code Dc in the second half cycle corresponds to a code sequence obtained by inverting the polarity of each bit of the code sequence of the demodulation code D2 in the second half cycle. Thus, the conversion code Dc allow an operation for code-demodulating the modulated current I2 and further inverting the polarity thereof to be realized with a single conversion operation. This allows the code demodulator 4b to generate the AC I32 by using the modulated current I2.

With the arrangement described above, the power transmission system 200 allows a plurality of DC powers to be concurrently and independently transmitted. In addition, the transmitted modulated power can be converted into desired AC power.

[3-4. Code Modulation and Demodulation Involving AC-DC Conversion]

In a fourth example operation, two ACs were code-modulated into two code-modulated currents, one of the code-modulated currents was then converted into a predetermined DC, and the other code-modulated current was code-demodulated.

In this example operation, control signals m1 to m4 input to the code modulator 43a had the code sequences illustrated in Table 3 described above. Control signals d1 to d4 input to the code demodulator 4a had the code sequences illustrated in Table 4 described above. Control signals m1 to m4 input to the code modulator 43b and control signals d1 to d4 input to the code demodulator 4b had the code sequences illustrated in Table 6 described above.

Figure 18A:
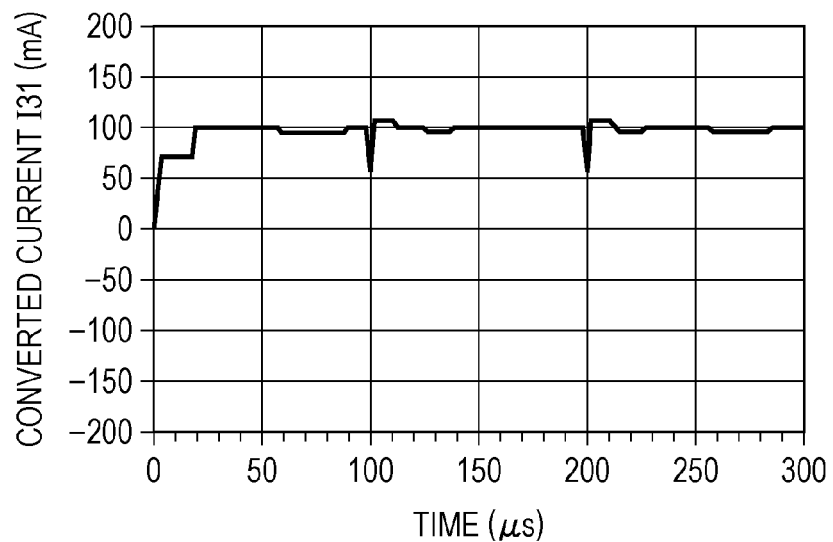
FIG. 18A is a graph illustrating the waveform of a converted current according to a fourth example operation in the first embodiment.
Figure 18B:
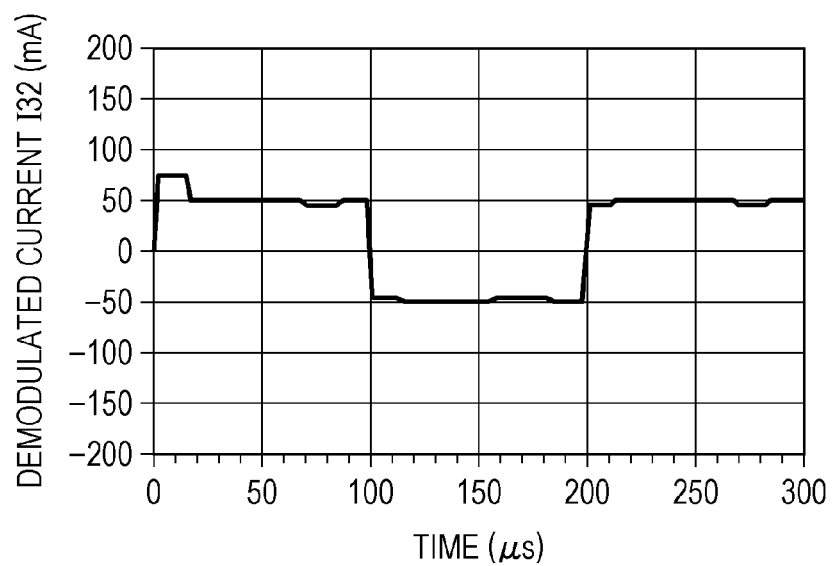
FIG. 18B is a graph illustrating the waveform of a demodulated current according to the fourth example operation in the first embodiment.

The waveforms of an input current I11A, an input current I12A, and a modulated current I2 were analogous to the waveforms illustrated in FIGS. 16A, 16B, and 16C, respectively. FIG. 18A and FIG. 18B illustrate the waveform of a converted current I31 and the waveform of a demodulated current I32, respectively.

Comparison between FIG. 16A and FIG. 18A shows that an AC I11 generated by the electric generator 1a was transmitted to the load 5a as the DC I31 through the code modulation and predetermined conversion. Comparison between FIG. 16B and FIG. 18B shows that an AC I12 generated by the electric generator 1b was transmitted to the load 5b through the code modulation and demodulation.

With the arrangement described above, the power transmission system 200 allows a plurality of AC powers to be concurrently and independently transmitted. In addition, the transmitted modulated power can be converted into desired DC power.

[3-5. Code Modulation and Demodulation of DC Power and AC Power]

In a fifth example operation, DC and AC were code-modulated into two code-modulated currents, and then the two code-modulated currents were code-demodulated into the DC and the AC.

In this example operation, control signals m1 to m4 input to the code modulator 43a and control signals d1 to d4 input to the code demodulator 4a had the code sequences illustrated in Table 4 described above. Control signals m1 to m4 input to the code modulator 43b and control signals d1 to d4 input to the code demodulator 4b had the code sequences illustrated in Table 6 described above.

FIGS. 19A, 19B, 19C, 19D, and 19E illustrate the waveforms of an input current I11A, an input current I12A, a modulated current I2, a demodulated current I31, and a demodulated current I32, respectively.

Figure 19A:
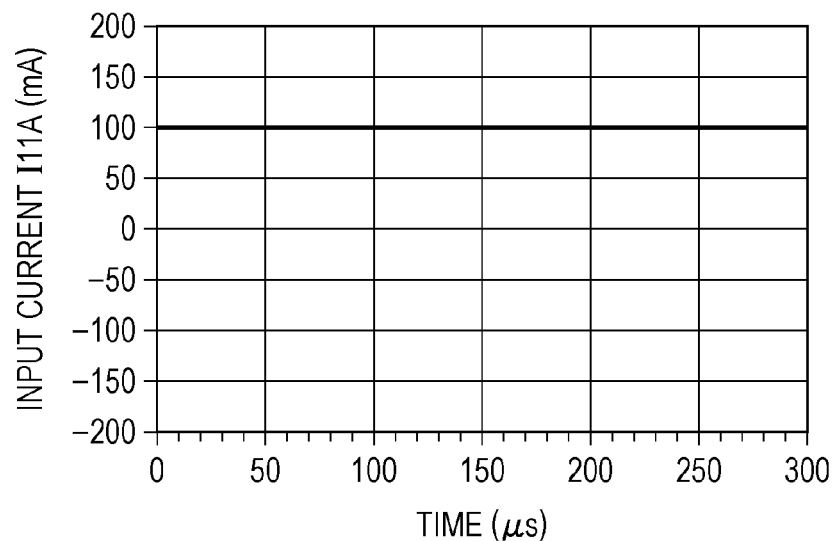
FIG. 19A is a graph illustrating the waveform of a first input current according to a fifth example operation in the first embodiment.
Figure 19B:
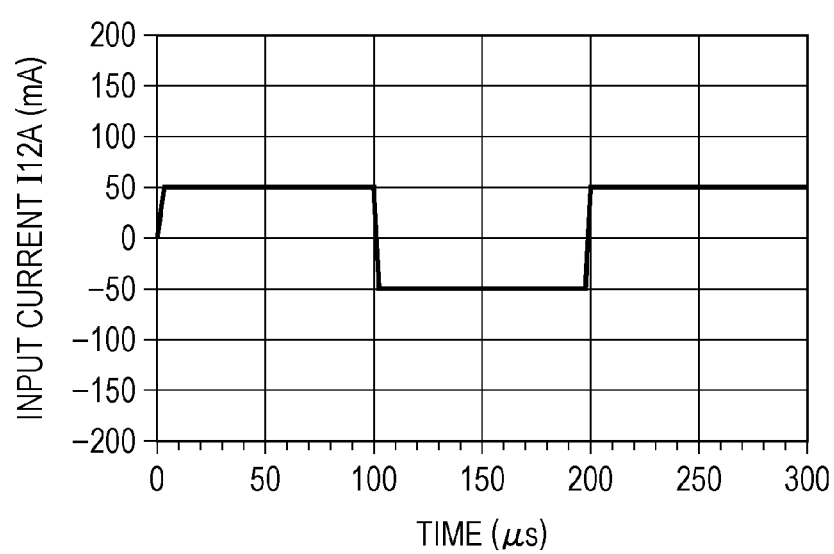
FIG. 19B is a graph illustrating the waveform of a second input current according to the fifth example operation in the first embodiment.
Figure 19C:
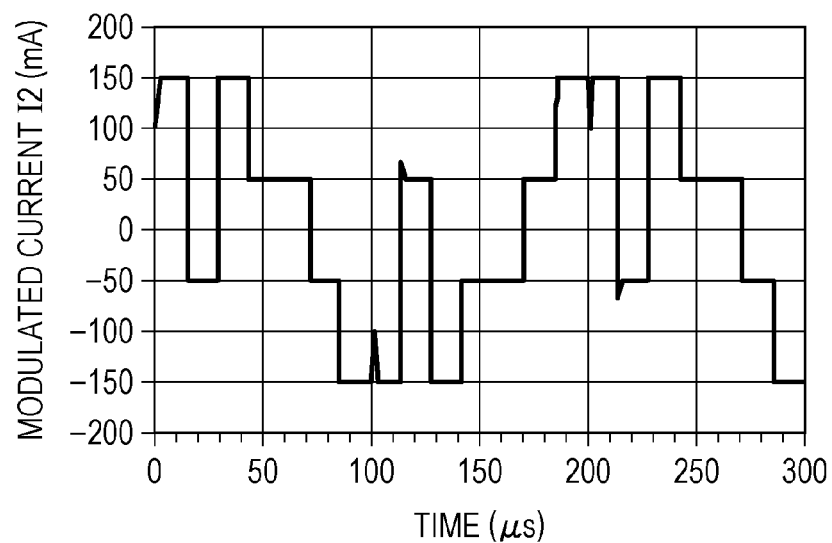
FIG. 19C is a graph illustrating the waveform of a modulated current according to the fifth example operation in the first embodiment.
Figure 19D:
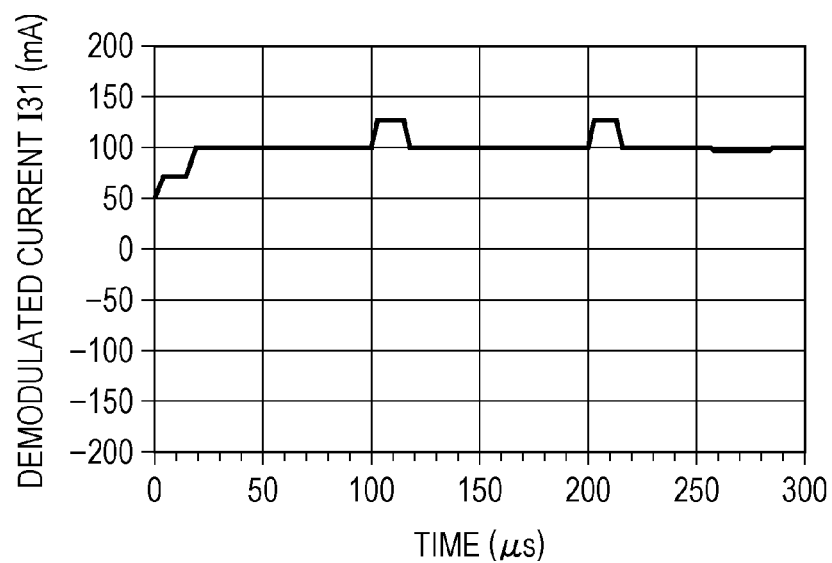
FIG. 19D is a graph illustrating the waveform of a first demodulated current according to the fifth example operation in the first embodiment.
Figure 19E:
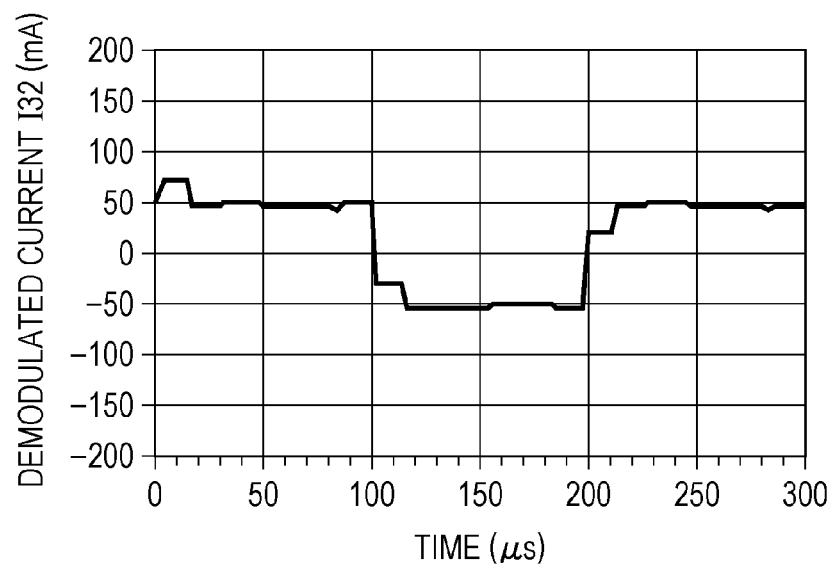
FIG. 19E is a graph illustrating the waveform of a second demodulated current according to the fifth example operation in the first embodiment.

Comparison between FIG. 19A and FIG. 19D shows that a DC I11 generated by the electric generator 1a was transmitted to the load 5a through the code modulation and demodulation. Comparison between FIG. 19B and FIG. 19E shows that an AC I12 generated by the electric generator 1b was transmitted to the load 5b through the code modulation and demodulation.

With the above-described operation, the power transmission system 200 allows DC power and AC power to be concurrently and independently transmitted.

[3-6. DC-Power and AC-Power Code Modulation and Demodulation Involving AC-DC Conversion]

In a sixth example operation, DC and AC were code-modulated into two code-modulated currents, one of the code-modulated currents was then code-demodulated into DC, and the other code-modulated current was converted into a predetermined DC.

In this example operation, control signals m1 to m4 input to the code modulator 43a and control signals d1 to d4 input to the code demodulator 4a had the code sequences illustrated in Table 4 described above. Control signals m1 to m4 input to the code modulator 43b had the code sequences illustrated in Table 6 described above. Control signals d1 to d4 input to the code demodulator 4b had the code sequences illustrated in Table 5 described above.

Figure 20A:
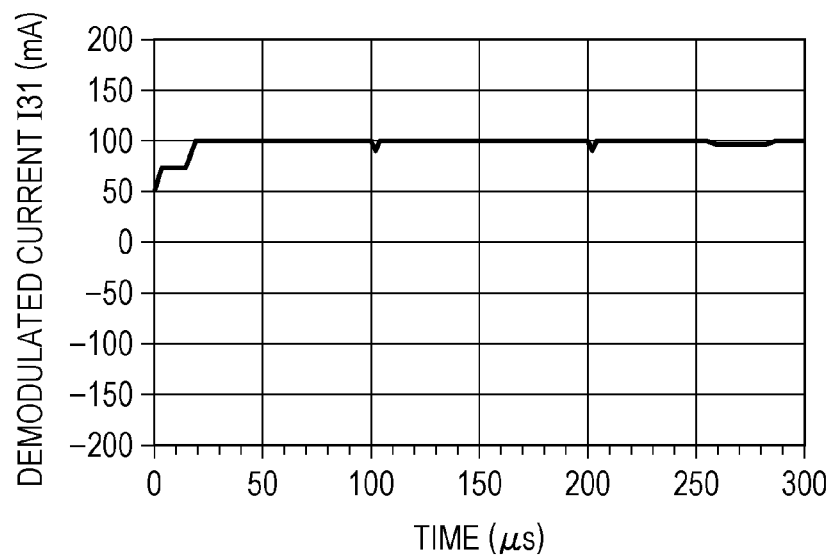
FIG. 20A is a graph illustrating the waveform of a demodulated current according to a sixth example operation in the first embodiment.
Figure 20B:
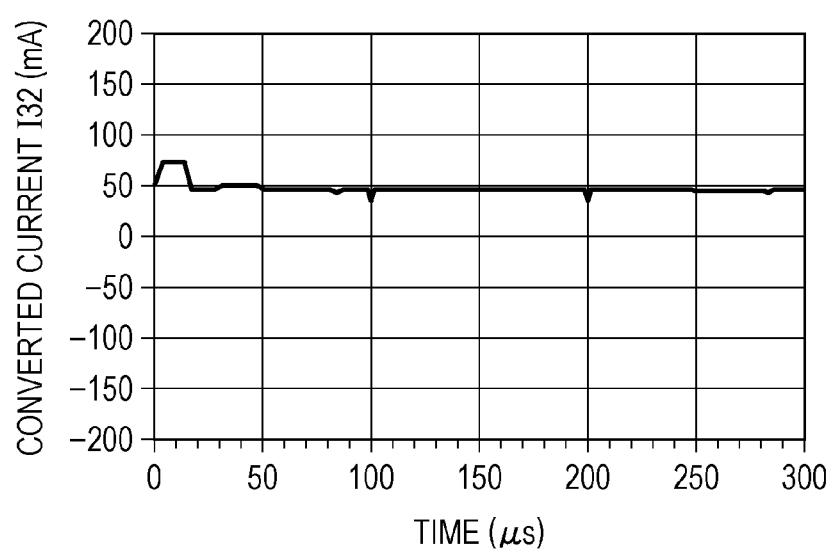
FIG. 20B is a graph illustrating the waveform of a converted current according to the sixth example operation in the first embodiment.

The waveforms of an input current I11A, an input current I12A, and a modulated current I2 were analogous to the respective waveforms illustrated in FIGS. 19A, 19B, and 19C. FIGS. 20A and 20B illustrate the waveforms of a demodulated current I31 and a converted current I32, respectively.

Comparison between FIG. 19A and FIG. 20A shows that a DC I11 generated by the electric generator 1a was transmitted to the load 5a through the code modulation and demodulation. Comparison between FIG. 19B and FIG. 20B shows that an AC I11 generated by the electric generator 1a was transmitted to the load 5b as the DC I32 through the code modulation and the predetermined conversion.

With the above-described operation, the power transmission system 200 allows DC power and AC power to be concurrently and independently transmitted. In addition, the transmitted modulated power can be converted into desired DC power.

[3-7. Supplement]

In the various example operations described above, the time average of the modulated current I2 was 0. That is, the modulated current I2 was an AC that does not include DC components. Thus, power transmission can be realized with high transmission efficiency.

Since a plurality of powers are transmitted through the same transmission path 3B, the transmission path 3B can be simplified. For example, when the transmission path 3B is a cable, it is possible to reduce the number of cables.

Since a plurality of modulated powers are combined, and the resulting modulated power is concurrently transmitted, for example, the transmission time can be reduced compared with a scheme in which powers in a plurality of channels are transmitted in a time-division manner. In addition, according to the code modulation and demodulation scheme, since each power is transmitted independently, the power transmission can be performed without affecting transmission of the other power.

Each of the code modulators 43a and 43b can execute code modulation by using arbitrary modulation code. Similarly, each of the code demodulators 4a and 4b can execute code demodulation by using arbitrary demodulation code. Alternatively, each of the code demodulators 4a and 4b can execute predetermined conversion by using arbitrary conversion code based on modulation code. Accordingly, pairing between the code modulator and the code demodulator can be flexibly changed in accordance with an arbitrary combination of a modulation code and a demodulation code. For example, in FIG. 13, power transmission from the electric generator 1a to the load 5b and power transmission from the electric generator 1b to the load 5a may be executed concurrently. Even when the number of pairing patterns increases, an increase in the size of the circuit scale may be suppressed. Accordingly, it is possible to realize power transmission with an apparatus having a reduced size.

Second Embodiment

1. Power Transmission System

Figure 21:
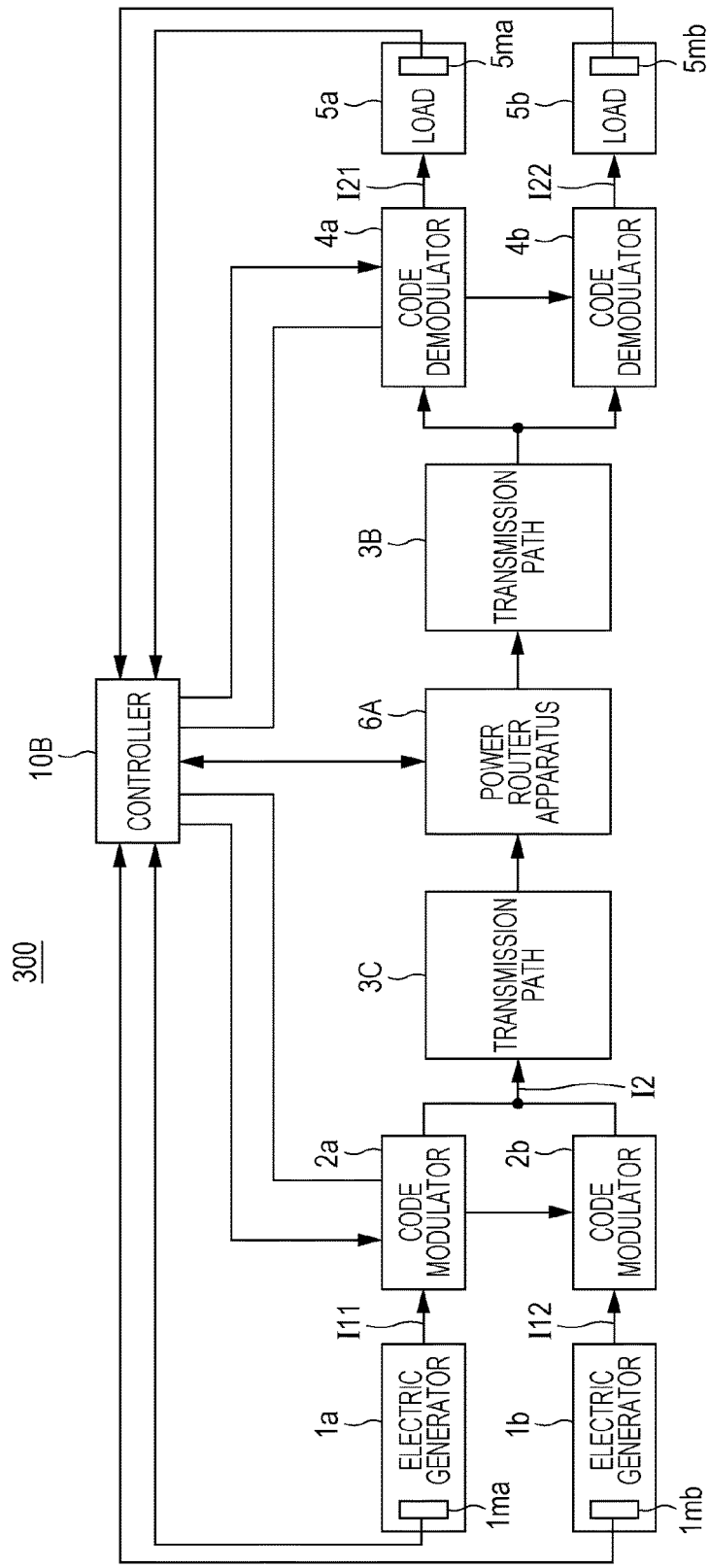
FIG. 21 is a block diagram illustrating an example configuration of a power transmission system according to a second embodiment.
Figure 22:
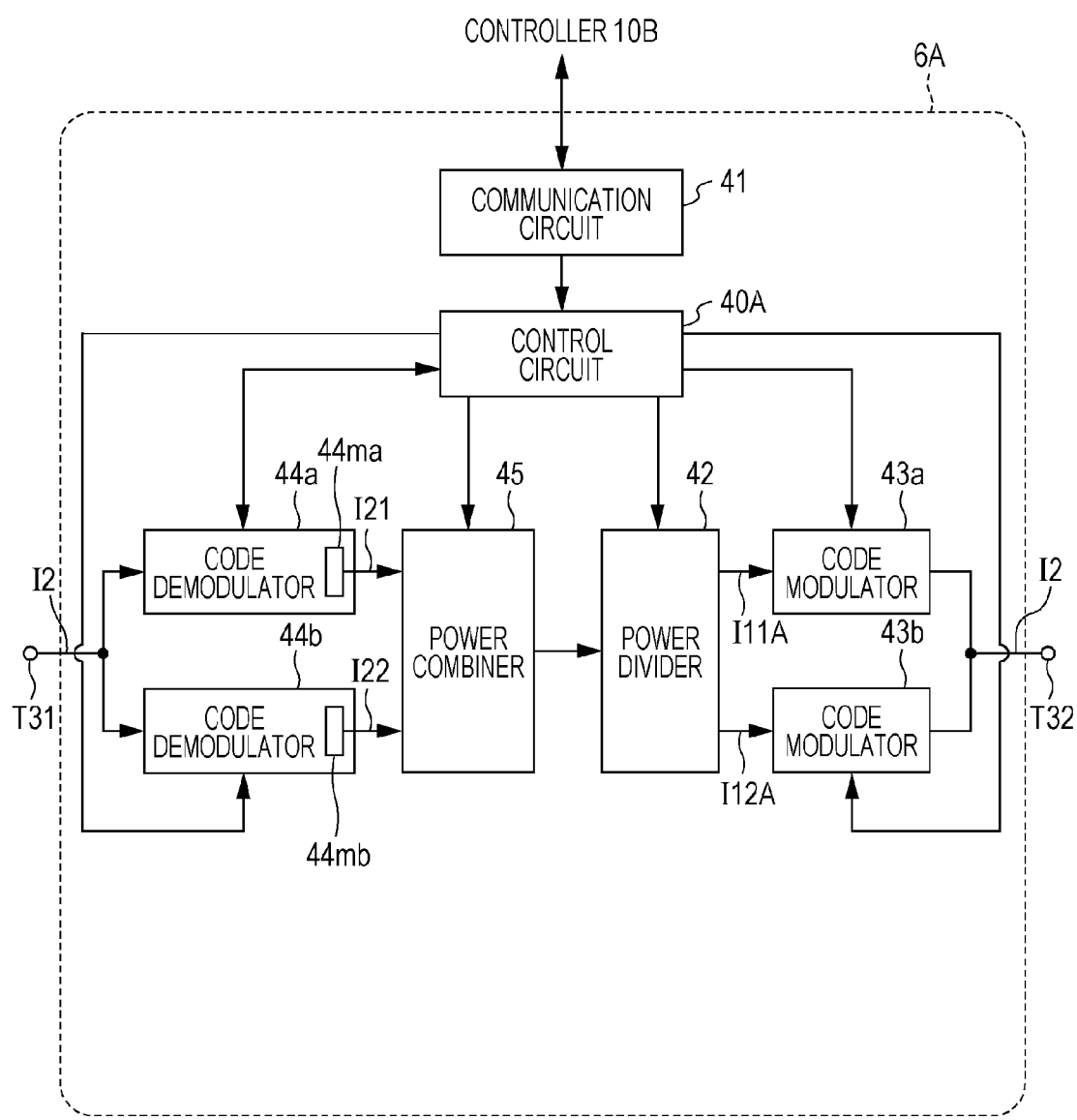
FIG. 22 is a block diagram illustrating an example configuration of a power router apparatus according to the second embodiment.

FIG. 21 illustrates an example configuration of a power transmission system 300 according to a second embodiment. FIG. 22 illustrates an example configuration of a power router apparatus 6A illustrated in FIG. 21. The power transmission system 300 in FIG. 21 differs from the power transmission system 200 in FIG. 13 in the following points.
(1) The power transmission system 300 includes code modulators 2a and 2b connected to respective electric generators 1a and 1b.
(2) The transmission path 3A through which generated power is transmitted is replaced with a transmission path 3C through which code-modulated power is transmitted.
(3) The power router apparatus 6 is replaced with the power router apparatus 6A. The power router apparatus 6A further includes code demodulators 44a and 44b and a power combiner 45.
(4) The controller 10A is replaced with a controller 10B. The controller 10B controls the operations of the code modulators 2a and 2b, the power router apparatus 6A, and code demodulators 4a and 4b.

That is, in FIG. 21, the power transmission system 300 includes the electric generators 1a and 1b, the code modulators 2a and 2b, the transmission path 3C, the power router apparatus 6A, a transmission path 3B, the code demodulators 4a and 4b, and loads 5a and 5b. The electric generators 1a and 1b have the power measuring instruments 1ma and 1mb, respectively. The loads 5a and 5b have power measuring instruments 5ma and 5mb, respectively.

The power measuring instrument 5ma measures the amount of power consumed by the load 5a and sends information about the measured amount of power to the controller 10B. The power measuring instrument 5mb measures the amount of power consumed by the load 5b and sends information about the measured amount of power to the controller 10B.

On the basis of information about those amounts of power, the controller 10B generates instruction signals for the code modulators 2a and 2b, the power router apparatus 6A, and the code demodulators 4a and 4b. The instruction signals include, for example, a synchronization signal for making the operations of the code modulators 2a and 2b and the operations of the code demodulators 44a and 44b in the power router apparatus 6A synchronize with each other and a synchronization signal for making the operations of the code modulators 43a and 43b in the power router apparatus 6 and the operations of the code demodulators 4a and 4b synchronize with each other. For example, the instruction signals transmitted to the code modulators 2a and 2b include code information regarding a modulation code, and the instruction signals transmitted to the power router apparatus 6A include code information regarding a demodulation code. For example, the instruction signals transmitted to the power router apparatus 6A further include code information regarding a modulation code, and the instruction signals transmitted to the code demodulators 4a and 4b include code information regarding a demodulation code. The instruction signals transmitted to the power router apparatus 6A may further include information regarding power division. The power division is set, for example, through reflection of powers requested by the loads 5a and 5b.

Powers generated by the electric generators 1a and 1b are input to the code modulators 2a and 2b, respectively. The code modulators 2a and 2b code-modulate the respective input powers on the basis of the instruction signals from the controller 10B. Two code-modulated powers are combined, and the resulting code-modulated power is transmitted to the power router apparatus 6A through the transmission path 3C.

On the basis of the instruction signals from the controller 10B, the power router apparatus 6A (a) code-demodulates the combined code-modulated power into a plurality of code-demodulated powers, (b) combines the code-demodulated powers into combined power, (c) divides the combined power into a plurality of divided powers, and (d) code-modulates the individual divided powers into code-modulated powers. The code-modulated powers are combined, and the combined code-modulated power is transmitted to the code demodulators 4a and 4b through the transmission path 3B.

On the basis of the instruction signals from the controller 10B, the code demodulators 4a and 4b code-demodulate the corresponding code-modulated powers to generate code-demodulated powers, respectively.

The loads 5a and 5b receive the corresponding code-demodulated powers.

2. Power Router Apparatus

In FIG. 22, the power router apparatus 6A includes a control circuit 40A, the communication circuit 41, the code demodulators 44a and 44b, the power combiner 45, the power divider 42, and the code modulators 43a and 43b. The code demodulators 44a and 44b have power measuring instruments 44ma and 44mb, respectively.

The code demodulator 44a is paired with the code modulator 2a, and the code demodulator 44b is paired with the code modulator 2b. The code modulator 43a is paired with the code demodulator 4a, and the code modulator 43b is paired with the code demodulator 4b.

The communication circuit 41 receives the instruction signals from the controller 10B and outputs the instruction signals to the control circuit 40A.

The control circuit 40A generates a plurality of control signals according to a first demodulation code on the basis of code information in the instruction signals and outputs the control signals to the code demodulator 44a. Similarly, the control circuit 40A generates a plurality of control signals according to a second demodulation code on the basis of the code information in the instruction signals and outputs the control signals to the code demodulator 44b.

On the basis of the power division information in the instruction signals, the control circuit 40A causes the power divider 42 to set a power dividing ratio.

On the basis of the code information in the instruction signals, the control circuit 40A generates a plurality of control signals according to a first modulation code and outputs the control signals to the code modulator 43a. Similarly, on the basis of the code information in the instruction signals, the control circuit 40A generates a plurality of control signals according to a second modulation code and outputs the control signals to the code modulator 43b.

The power measuring instruments 44ma and 44mb measure the respective amounts of power generated by the code demodulators 44a and 44b and transmit information about the amounts of power to the control circuit 40A. The control circuit 40A transmits the information to the controller 10B via the communication circuit 41.

The code demodulator 44a code-demodulates the code-modulated power, input via a terminal T31, with the first demodulation code to generate first code-demodulated power. The code demodulator 44b code-demodulates the code-modulated power with the second demodulation code to generate second code-demodulated power. The first and second code-demodulated powers are output to the power combiner 45.

The power combiner 45 combines the first and second code-demodulated powers to generate combined power. The combined power is output to the power divider 42. The power divider 42 may have, for example, a resistance dividing circuit or a transformer for division.

The power divider 42 divides the combined power into first divided power and second divided power at a set dividing ratio. The first and second divided powers are output to the code modulators 43a and 43b, respectively.

The code modulator 43a code-modulates the first divided power with the first modulation code to generate first code-modulated power. The code modulator 43b code-modulates the second divided power with the second modulation code to generate second code-modulated power. The first and second code-modulated powers are combined, and the combined code-modulated power is output to the transmission path 3B via a terminal T32.

The power transmission system 300 executes the code modulation and demodulation twice. The code modulation operation performed by the code modulators 43a and 43b and the code demodulation operation performed by the code demodulators 4a and 4b are substantially the same as those described in, for example, the first embodiment, and thus descriptions thereof are not given hereinafter. Also, the code modulation operation performed by the code modulators 2a and 2b and the code demodulation operation performed by the code demodulators 44a and 44b are substantially the same as the code modulation operation performed by the code modulators 43a and 43b and the code demodulation operation performed by the code demodulators 4a and 4b, except that the control signals are different, and thus descriptions thereof are given hereinafter.

In the power transmission system 200, power can be transmitted from the electric generators 1a and 1 b to the loads 5a and 5b with high efficiency and flexibly in accordance with the type of power.

In addition, since the power router apparatus 6A has the code demodulators 44a and 44b, the amounts of power transmitted from the electric generators 1a and 1 b can be independently and accurately determined in the power router apparatus 6A. Thus, information about the amount of power of each electric generator may be utilized for, for example, buying and selling power.

Third Embodiment

1. Power Router Apparatus

Figure 23:
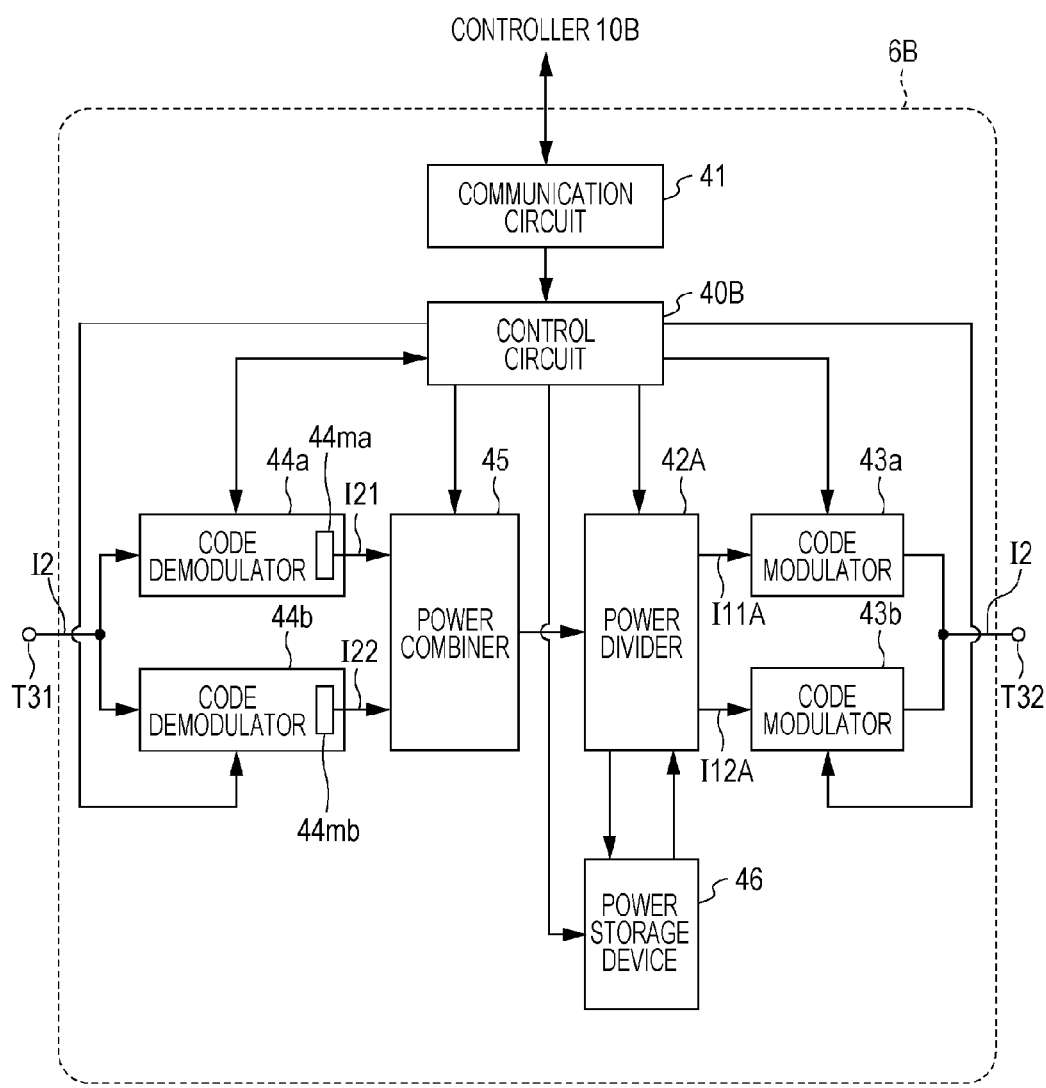
FIG. 23 is a block diagram illustrating an example configuration of a power router apparatus according to a third embodiment.

FIG. 23 illustrates an example configuration of a power router apparatus 6B in a power transmission system according to a third embodiment. The power router apparatus 6B in FIG. 23 differs from the power router apparatus 6A in FIG. 22 in the following points.

(1) The power router apparatus 6B includes a power storage device 46. The power storage device 46 includes, for example, a battery and/or a capacitor.

(2) The power divider 42 is replaced with a power divider 42A. The power divider 42A divides power for code modulators 43a and 43b and the power storage device 46.

(3) The control circuit 40A is replaced with a control circuit 40B. The control circuit 40B controls code demodulators 44a and 44b, a power combiner 45, the power divider 42A, the power storage device 46, and the code modulators 43a and 43b.

2. Power Divider

Figure 24:
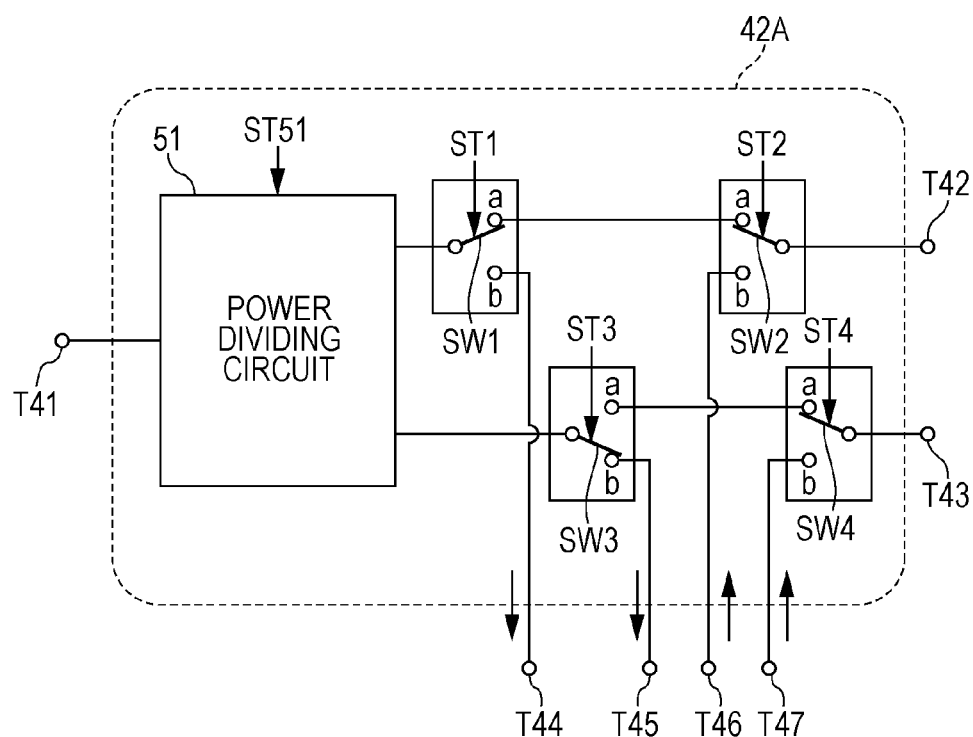
FIG. 24 is a block diagram illustrating an example configuration of a power divider according to the third embodiment.

FIG. 24 illustrates an example configuration of the power divider 42A. In FIG. 24, the power divider 42A includes a power dividing circuit 51, switches SW1 to SW4, and terminals T41 to T47.

The terminal T41 is connected to the power combiner 45, the terminal T42 is connected to the code modulator 43a, and the terminal T43 is connected to the code modulator 43b. The terminals T44 to T47 are connected to the power storage device 46.

A control signal ST51 specifying a power dividing ratio is input to the power dividing circuit 51 from the control circuit 40B. On the basis of the specified dividing ratio, the power dividing circuit 51 divides the power input via the terminal T41 into first divided power and second divided power. The power dividing circuit 51 may have, for example, a resistance dividing circuit or a transformer for division.

Switching control signals ST1 to ST4 from the control circuit 40B are input to the switches SW1 to SW4, respectively.

When the switches SW1 and SW2 are connected to respective contact points a, the first divided power is output to the code modulator 43a via the switches SW1 and SW2 and the terminal T42. As a result, the first divided power is supplied to the load 5a without being supplied to the power storage device 46.

When the switch SW1 is connected to a corresponding contact point b, and the switch SW2 is connected to the corresponding contact point a, the first divided power is output to the power storage device 46 via the switch SW1 and the terminal T44. As a result, the first divided power is stored in the power storage device 46 and is supplied to the load 5a.

When the switch SW1 is connected to the corresponding contact point b, and the switch SW2 is connected to a corresponding contact point b, the first divided power is output to the power storage device 46 via the switch SW1 and the terminal T44 and is then output to the code modulator 43a via the terminal T46, the switch SW2, and the terminal T42. As a result, when the first divided power is larger than the power consumed by the load 5a, some of the first divided power is stored in the power storage device 46, and the remainder is supplied to the load 5a. Conversely, when the first divided power is smaller than the power consumed by the load 5a, the first divided power and power discharged from the power storage device 46 are supplied to the load 5a.

When the switches SW3 and SW4 are connected to respective contact points a, the second divided power is output to the code modulator 43b via the switches SW3 and SW4 and the terminal T43. As a result, the second divided power is supplied to the load 5b without being supplied to the power storage device 46.

When the switch SW3 is connected to a corresponding contact point b, and the switch SW4 is connected to the corresponding contact point a, the second divided power is output to the power storage device 46 via the switch SW3 and the terminal T45. As a result, the second divided power is stored in the power storage device 46 and is not supplied to the load 5b.

When the switch SW3 is connected to the corresponding contact point b, and the switch SW4 is connected to a corresponding contact point b, the second divided power is output to the power storage device 46 via the switch SW3 and the terminal T45 and is then output to the code modulator 43b via the terminal T47, the switch SW4, and the terminal T43. As a result, when the second divided power is larger than the power consumed by the load 5b, some of the second divided power is stored in the power storage device 46, and the remainder is supplied to the load 5b. Conversely, when the second divided power is smaller than the power consumed by the load 5b, the second divided power and power discharged from the power storage device 46 are supplied to the load 5b.

When the total of powers generated by the electric generators 1a and 1b is larger than the total of powers consumed by the loads 5a and 5b, excessive power can be stored in the power storage device 46 in the power router apparatus 6B. Conversely, when the total of powers generated by the electric generators 1a and 1b is smaller than the total of powers consumed by the loads 5a and 5b, a shortage in power can be compensated for by discharged power from the power storage device 46 in the power router apparatus 6B. As a result, the power router apparatus 6B can efficiently and reliably utilize power.

3. Modifications of Power Divider

[3-1. First Modification]

Figure 25:
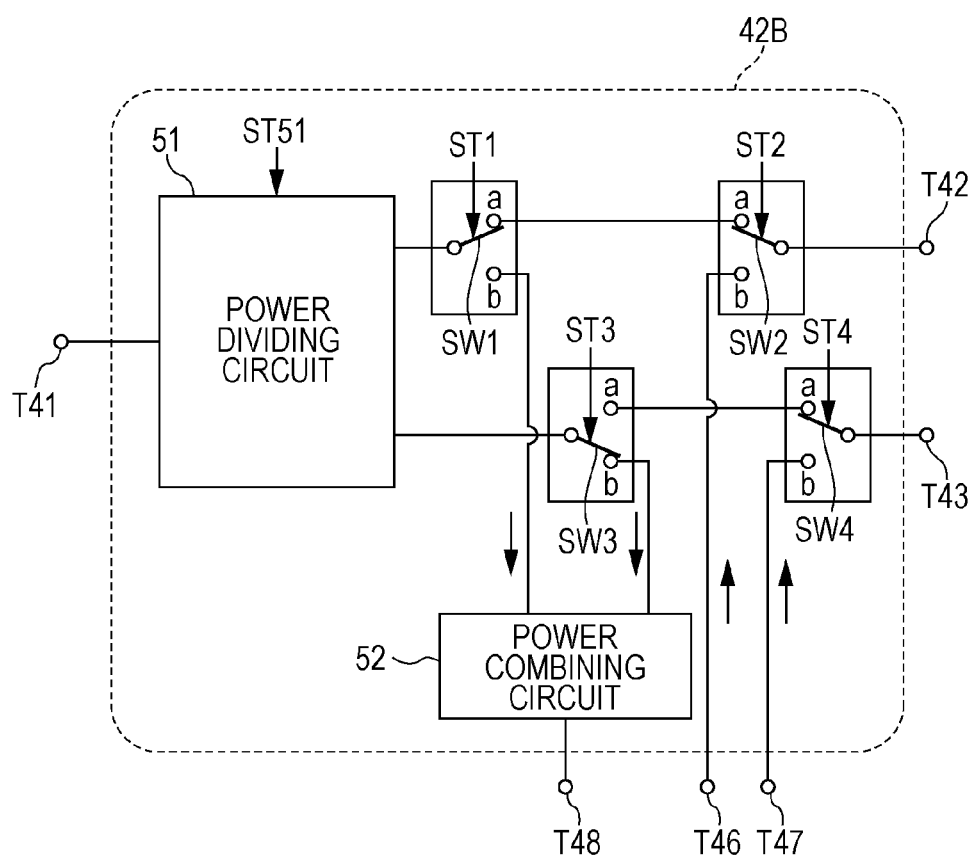
FIG. 25 is a block diagram illustrating the configuration of a power divider according to a first modification in the third embodiment.

FIG. 25 illustrates the configuration of a power divider 42B according to a first modification. The power divider 42B in FIG. 25 differs from the power divider 42A in FIG. 24 in that the terminals T44 and T45 are replaced with a power combining circuit 52 and a terminal T48.

The power combining circuit 52 is connected to a contact point b of a switch SW1 and to a contact point b of a switch SW3. The power combining circuit 52 combines powers input from the switches SW1 and SW3 and outputs the combined power to a power storage device 46 via the terminal T48. The power combining circuit 52 may have, for example, a resistance combiner. The resistance combiner has, for example, two branched input ports, that is, first and second input ports, and one output port. In this case, powers can be combined in accordance with the ratio of the value of resistance across the first input port and the output port to the value of resistance across the second input port and the output port. Alternatively, when the input power is AC power, the power combining circuit 52 may have a transformer for combination. The transformer has, for example, two input-side coils, that is, first and second input-side coils, and an output-side coil that couples with the input-side coils. In this case, powers can be combined in accordance with the ratio of a coefficient of coupling between the first input-side coil and the output-side coil to a coefficient of coupling between the second input-side coil and the output-side coil.

In the case of DC and AC, the power combination can be implemented by a resistance combiner that combines powers in accordance with the ratio of resistance across branched ports. Also, in the case of AC, the power combination can be implemented by, for example, a transformer combiner for combining powers in accordance with the ratio of coupling between an input-side coil and an output-side coil by using a transformer.

[3-2. Second Modification]

Figure 26:
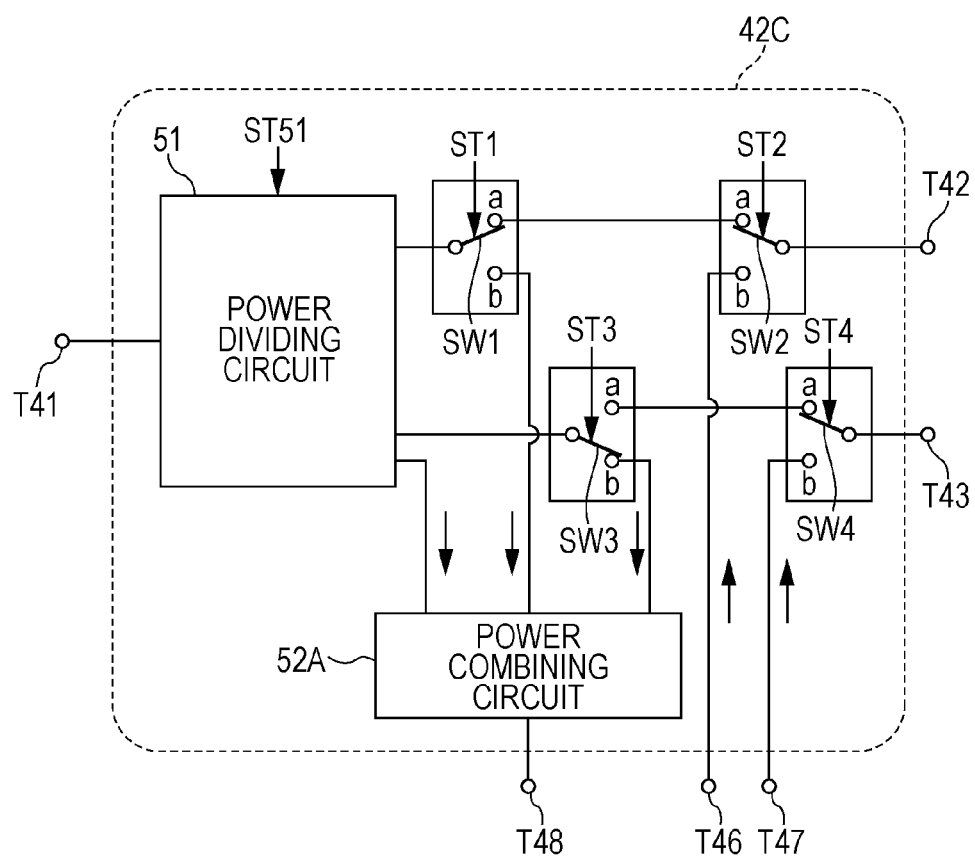
FIG. 26 is a block diagram illustrating the configuration of a power divider according to a second modification in the third embodiment.

FIG. 26 illustrates the configuration of a power divider 42C according to a second modification. The power divider 42C in FIG. 26 differs from the power divider 42B in FIG. 25 in that the power combining circuit 52 is replaced with a power combining circuit 52A.

In FIG. 26, a power dividing circuit 51 divides power input from a terminal T41 into three powers and outputs one of the powers to the power combining circuit 52A. The power combining circuit 52A combines the power from the power dividing circuit 51, power from a switch SW1, and power from a switch SW3 and outputs combined power to a power storage device 46 via a terminal T48.

[3-3. Third Modification]

Figure 27:
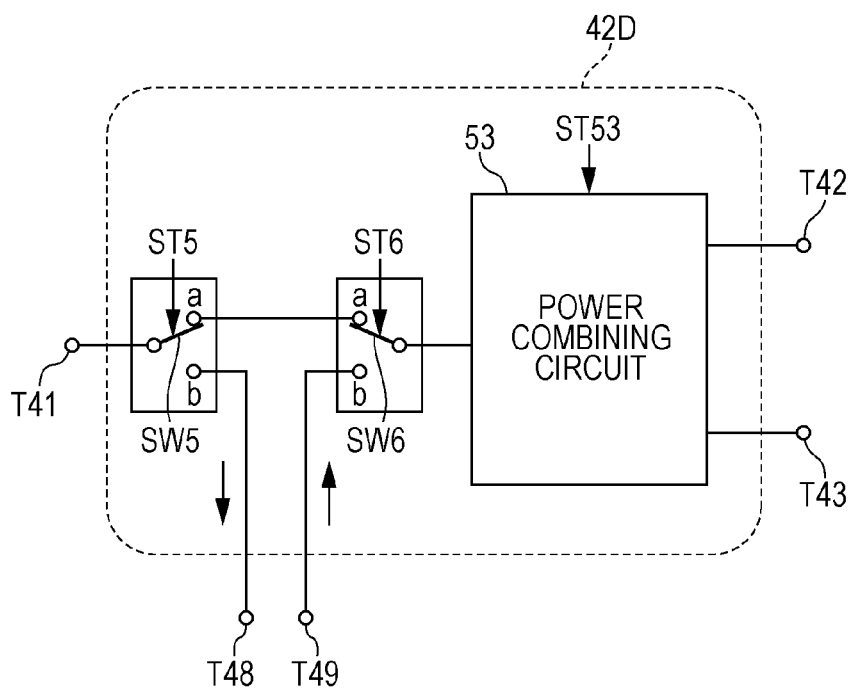
FIG. 27 is a block diagram illustrating the configuration of a power divider according to a third modification in the third embodiment.

FIG. 27 illustrates the configuration of a power divider 42D according to a third modification. The power divider 42D in FIG. 27 includes switches SW5 and SW6, a power dividing circuit 53, and terminal T48 and T49. A control signal ST53 that specifies a power dividing ratio is input to the power dividing circuit 53 from the control circuit 40B. Switching control signals ST5 and ST6 from the control circuit 40B are input to the switches SW5 to SW6, respectively.

When the switches SW5 and SW6 are connected to respective contact points a, power input to a terminal T41 is input to the power dividing circuit 53 via the switches SW5 and SW6, and the power dividing circuit 53 divides the input power into first divided power and second divided power. The first divided power is output to the code modulator 43a via a terminal T42, and the second divided power is output to a code modulator 43b via a terminal T43. As a result, the input power is supplied to the loads 5a and 5b without being supplied to the power storage device 46.

When the switch SW5 is connected to a corresponding contact point b, and the switch SW6 is connected to the corresponding contact point a, power input to the terminal T41 is output to the power storage device 46 via the switch SW5 and the terminal T48. As a result, the input power is stored in the power storage device 46 and is not supplied to the loads 5a and 5b.

When the switch SW5 is connected to the corresponding contact point b, and the switch SW6 is connected to a corresponding contact point b, power input to the terminal T41 is output to the power storage device 46 via the switch SW5 and the terminal T48 and is then input to the power dividing circuit 53 via a terminal T49 and the switch SW6, and the power dividing circuit 53 divides the input power into first divided power and second divided power. The first divided power is output to the code modulator 43a via the terminal T42, and the second divided power is output to the code modulator 43b via the terminal T43. As a result, when the total of powers generated by the electric generators 1a and 1 b is larger than the total of powers consumed by the loads 5a and 5b, some of the generated power is stored in the power storage device 46, and the remainder is supplied to the loads 5a and 5b. Conversely, when the total of the generated powers is smaller than the total of the powers consumed, the generated power and power discharged from the power storage device 46 are supplied to the loads 5a and 5b.

[3-4. Fourth Modification]

Figure 28:
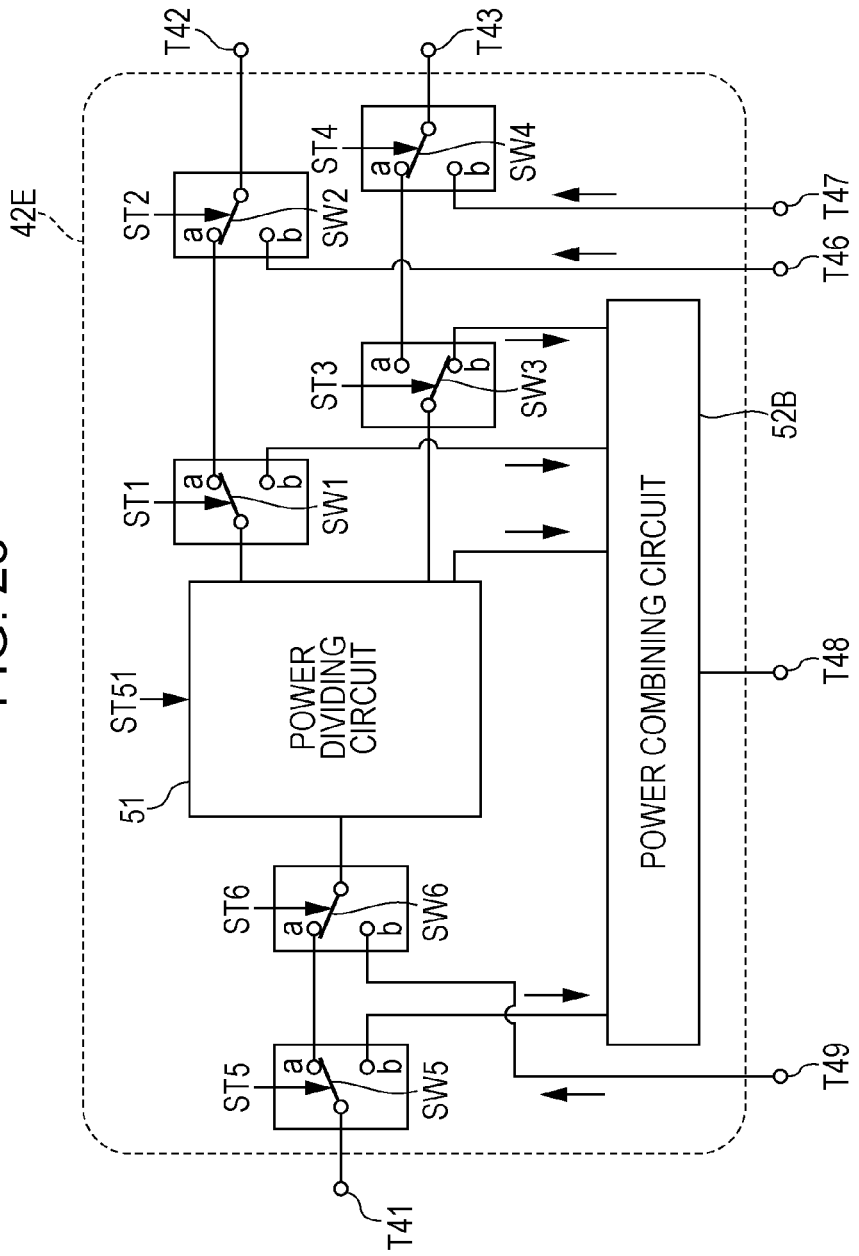
FIG. 28 is a block diagram illustrating the configuration of a power divider according to a fourth modification in the third embodiment.

FIG. 28 illustrates the configuration of a power divider 42E according to a fourth modification. The power divider 42E in FIG. 28 has a configuration in which the power divider 42C in FIG. 26 is provided at a stage subsequent to the power divider 42D in FIG. 27. The power divider 42E in FIG. 28 includes a power combining circuit 52B in place of the power combining circuit 52A.

An output terminal of the switch SW6 is connected to an input terminal of the power dividing circuit 51.

The power combining circuit 52B combines power from the switch SW5, power from the power dividing circuit 51, power from the switch SW1, and power from the switch SW3 and outputs combined power to the power storage device 46 via the terminal T48.

Other Embodiments

The present disclosure is not limited to the specific examples described above in the reference modes and the embodiments. The disclosed technology is not limited to the specific examples and also encompasses any modes obtained by performing a change, replacement, addition, omission, and so on to the above-described modes. The present disclosure further encompasses a combination of the embodiments and/or the reference modes.

Although, in the first to third embodiments described above, the power transmission system has two electric generators and two loads, the number of electric generators and the number of loads are not limited thereto. For example, the power transmission system may have one electric generator and two or more loads or may have three or more electric generators and three or more loads.

Although, in the first and second reference modes and the first embodiment, the code sequence of the control signals, the code sequence of the modulation code, and the code sequence of the demodulation code each include one or more orthogonal Gold sequences, the present disclosure is not limited thereto. For example, the modulation code and the demodulation code may include other orthogonal codes. Examples of the other orthogonal codes include an m sequence.

Although, in the first and second reference modes and the first embodiment, each code length of the control signals, the modulation codes, and the demodulation codes is 7 bits or 14 bits, the present disclosure is not limited thereto. The larger the code length, the larger the number of orthogonal codes that can be generated. Also, when the code length is increased, correlation between the codes decreases to thereby make it possible to more accurately divide power.

Although, in the first embodiment, the code modulator and the code demodulator have been described as being the respective circuits illustrated in FIGS. 9 and 10, they may be implemented by, for example, the circuit illustrated in FIG. 7. In such a case, the circuit configuration of the code modulator and the code demodulator is simplified, thereby making it possible to realize a reduction in cost and a reduction in the size of the apparatus.

Although an example in which the current is code-modulated and code-demodulated has been described in the first and second reference modes and the first embodiment, the voltage may be code-modulated and code-demodulated or the current and the voltage may be modulated and demodulated.

Although an example in which the generated current and the input current are equal to each other has been described in the first embodiment, the present disclosure is not limited thereto.

Although an example in which the bidirectional switch circuit includes two switches has been described in the second reference mode, the bidirectional switch circuit may be implemented by, for example, a single bidirectional switch.

In the first and second embodiments, the controller and the control circuit in the power router apparatus may be shared. For example, in the power transmission system, the controller may be omitted, and the communication circuit in the power router apparatus may be omitted. In such a case, the control circuit in the power router apparatus can execute the operation of the controller described above in each embodiment. This makes it possible to reduce the size of the system, simplify the system and reduce cost.

Overview of Embodiments a power router apparatus according to one aspect of the present disclosure includes: a power divider that divides predetermined power into a plurality of divided powers including first divided power and second divided power; a first code modulator that code-modulates the first divided power with a first modulation code to generate first code-modulated power; and a second code modulator that code-modulates the second divided power with a second modulation code to generate second code-modulated power. The first code-modulated power is AC power, and the second code-modulated power is AC power.

For example, at least one of the first modulation code and the second modulation code may include an orthogonal code.

For example, the first code modulator may include a first circuit having a plurality of first switches; and the first code modulator may include a second circuit having a plurality of second switches.

For example, the first code modulator may include a first H-bridge circuit in which four first bidirectional switch circuits are connected in a full-bridge configuration; and the second code modulator may include a second H-bridge circuit in which four second bidirectional switch circuits are connected in a full-bridge configuration.

For example, the first code modulator may further include a first control circuit that generates a plurality of first control signals that turn on or off the first switches; and the second code modulator may further include a second control circuit that generates a plurality of second control signals that turn on or off the second switches. The first circuit may code-modulate the first divided power, based on the first control signals; and the second circuit may code-modulate the second divided power, based on the second control signals.

For example, the first divided power may be DC power or AC power, and the second divided power may be DC power or AC power.

For example, the power router apparatus may further include: a first code demodulator that code-demodulates a third code-modulated power with a first demodulation code to generate first code-demodulated power; a second code demodulator that code-demodulates a fourth code-modulated power with a second demodulation code to generate second code-demodulated power; and a power combiner that combines a plurality of code-demodulated powers including the first code-demodulated power and the second code-demodulated power to generate combined power. The predetermined power is the combined power, and the third code-modulated power is AC power, and the fourth code-modulated power is AC power.

For example, at least one of the first demodulation code and the second demodulation code may include an orthogonal code.

For example, the first code-demodulated power may be DC power or AC power, and the second code-demodulated power may be DC power or AC power.

For example, the power router apparatus may further include a power storage device that stores at least one of the divided powers.

A power transmission system according to one aspect of the present disclosure includes the power router apparatus.

In the power transmission system according to the present disclosure, for example, power can be transmitted from an electric generator, such as a photovoltaic generator, a wind power generator, or a hydroelectric power generator to a train, an electric vehicle (EV), or the like.

What is claimed is:
1. A power router apparatus comprising:
a power divider that divides predetermined power into a plurality of divided powers including first divided power and second divided power;
a first code modulator that code-modulates the first divided power with a first modulation code to generate first code-modulated power, which is alternating-current power; and
a second code modulator that code-modulates the second divided power with a second modulation code to generate second code-modulated power, which is alternating-current power.

2. The power router apparatus according to claim 1, wherein at least one of the first modulation code and the second modulation code includes an orthogonal code.
3. The power router apparatus according to claim 1, wherein the first code modulator includes a first circuit including a plurality of first switches; and
the second code modulator includes a second circuit including a plurality of second switches.
4. The power router apparatus according to claim 1, wherein the first code modulator includes a first H-bridge circuit in which four first bidirectional switch circuits are connected in a full-bridge configuration; and
the second code modulator includes a second H-bridge circuit in which four second bidirectional switch circuits are connected in a full-bridge configuration.
5. The power router apparatus according to claim 3, wherein the first code modulator further includes a first control circuit that generates a plurality of first control signals that turn on or off the first switches;
the second code modulator further includes a second control circuit that generates a plurality of second control signals that turn on or off the second switches;
the first circuit code-modulates the first divided power, based on the first control signals; and
the second circuit code-modulates the second divided power, based on the second control signals.
6. The power router apparatus according to claim 1, wherein the first divided power is direct-current power or alternating-current power, and
the second divided power is direct-current power or alternating-current power.
7. The power router apparatus according to claim 1, further comprising:
a first code demodulator that code-demodulates a third code-modulated power, which is alternating-current power, with a first demodulation code to generate first code-demodulated power;
a second code demodulator that code-demodulates a fourth code-modulated power, which is alternating-current power, with a second demodulation code to generate second code-demodulated power; and
a power combiner that combines a plurality of code-demodulated powers including the first code-demodulated power and the second code-demodulated power to generate combined power as the predetermined power.
8. The power router apparatus according to claim 7, wherein at least one of the first demodulation code and the second demodulation code includes an orthogonal code.
9. The power router apparatus according to claim 7, wherein the first code-demodulated power is direct-current power or alternating-current power, and
the second code-demodulated power is direct-current power or alternating-current power.
10. The power router apparatus according to claim 1, further comprising:
a power storage device that stores at least one of the divided powers.

* * * * *